US012708057B2

(12) United States Patent
Li et al.

(10) Patent No.: US 12,708,057 B2
(45) Date of Patent: Aug. 11, 2026

(54) PACKAGE COMPRISING SIDEWALL INTERCONNECTS CONFIGURED FOR POWER ROUTING

(71) Applicant: QUALCOMM Incorporated, San Diego, CA (US)

(72) Inventors: Xia Li, San Diego, CA (US); Xuefeng Zhang, San Diego, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 531 days.

(21) Appl. No.: 18/340,556

(22) Filed: Jun. 23, 2023

(65) Prior Publication Data

US 2024/0429141 A1 Dec. 26, 2024

(51) Int. Cl.
*H10W 90/00* (2026.01)
*H10W 70/60* (2026.01)
*H10W 70/65* (2026.01)
*H10W 70/685* (2026.01)
*H10W 74/10* (2026.01)

(52) U.S. Cl.
CPC ........ *H10W 90/701* (2026.01); *H10W 70/611* (2026.01); *H10W 70/657* (2026.01); *H10W 70/685* (2026.01); *H10W 74/117* (2026.01); *H10W 90/00* (2026.01); *H10W 90/724* (2026.01)

(58) Field of Classification Search
CPC ........ H01L 23/49811; H01L 23/49805; H10W 90/701; H10W 70/611; H10W 90/00; H10W 90/20; H10W 70/614
See application file for complete search history.

(56) References Cited

U.S. PATENT DOCUMENTS

2017/0345778 A1* 11/2017 Gremillet .............. H01L 23/053
2021/0183777 A1 6/2021 Yim et al.
2023/0395477 A1* 12/2023 Lee .................. H01L 23/49805
2024/0379525 A1* 11/2024 Kim .................... H01L 23/3128

FOREIGN PATENT DOCUMENTS

CN 114792669 A 7/2022
WO 2016107692 A1 7/2016
WO 2018111263 A1 6/2018
WO 2018182598 A1 10/2018

OTHER PUBLICATIONS

International Search Report and Written Opinion—PCT/US2024/033025—ISA/EPO—Oct. 16, 2024.

* cited by examiner

*Primary Examiner* — Evan G Clinton
(74) *Attorney, Agent, or Firm* — Loza & Loza, LLP

(57) ABSTRACT

A device comprising a package. The package comprises a package substrate; a first integrated device coupled to the package substrate through a first plurality of bump interconnects; an encapsulation layer at least partially encapsulating the first integrated device; a plurality of post interconnects located in the encapsulation layer; a metallization portion coupled to the plurality of post interconnects; a second integrated device coupled to the metallization portion through a second plurality of bump interconnects; and a plurality of side wall interconnects coupled to the encapsulation layer and the metallization portion.

20 Claims, 15 Drawing Sheets

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

CROSS SECTIONAL SIDE PROFILE VIEW

PLAN VIEW

CROSS SECTIONAL SIDE PROFILE VIEW

PLAN VIEW

PLAN VIEW

1 CARRIER + INTEGRATED DEVICE 190 109 919 900 913

2 ENCAPSULATION LAYER 109 114 900 913

3 METALLIZATION PORTION 140 142 109 114 900 104

FIG. 9A

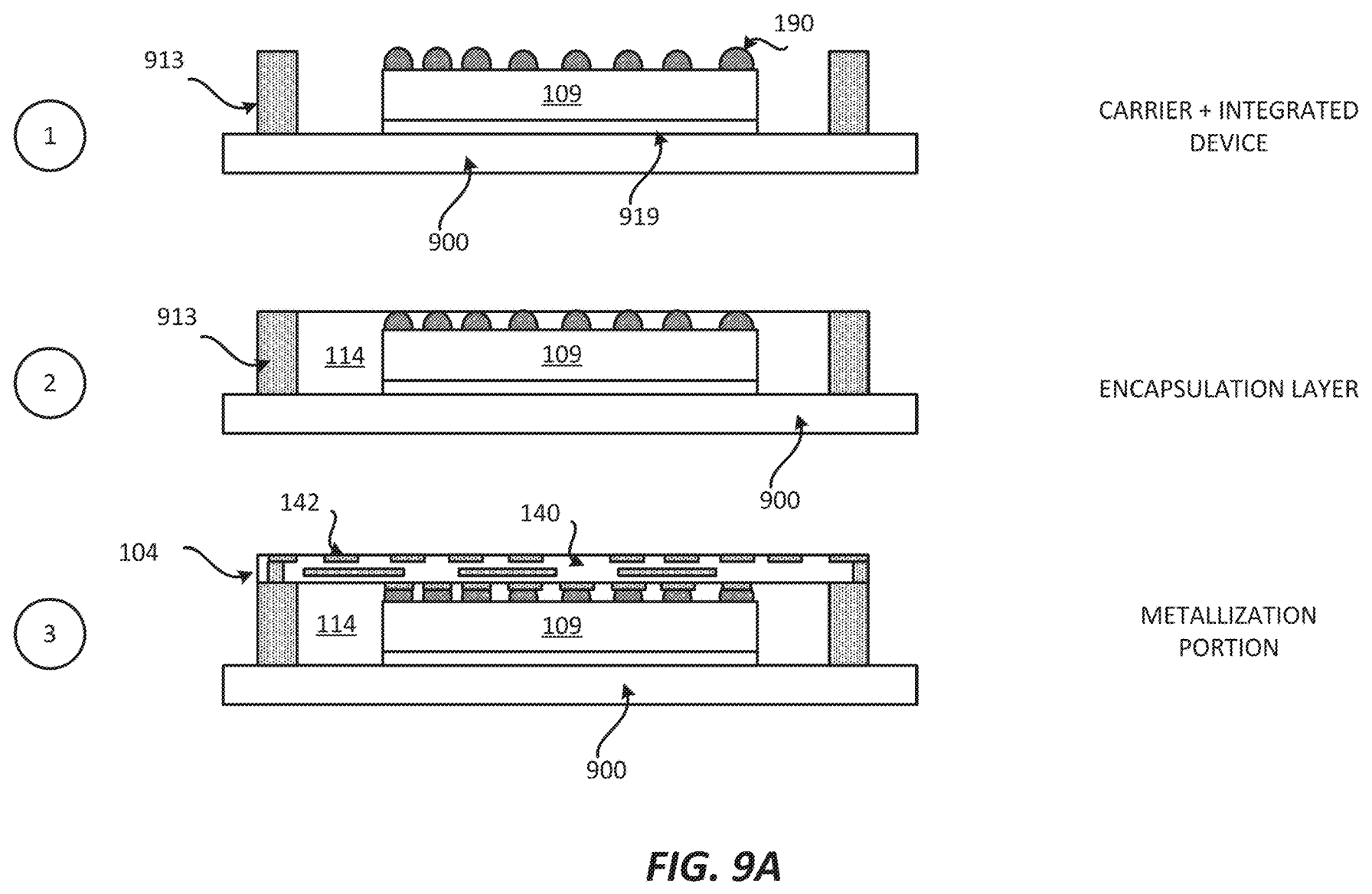

INTEGRATED DEVICES

ENCAPSULATION FORMATION

PACKAGE SUBSTRATE COUPLING

BOARD COUPLING

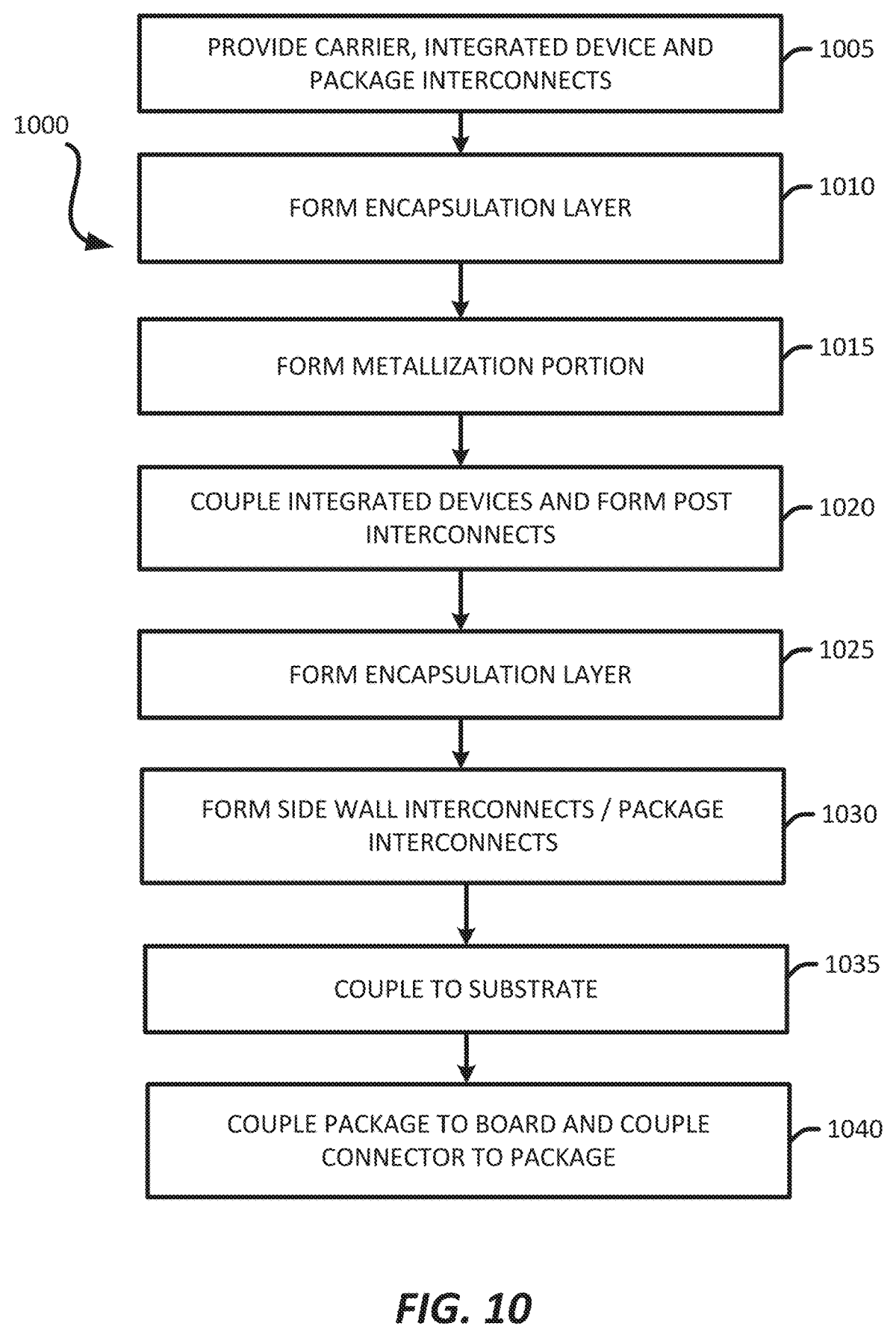

PROVIDE CARRIER, INTEGRATED DEVICE AND PACKAGE INTERCONNECTS — 1005

FORM ENCAPSULATION LAYER — 1010

FORM METALLIZATION PORTION — 1015

COUPLE INTEGRATED DEVICES AND FORM POST INTERCONNECTS — 1020

FORM ENCAPSULATION LAYER — 1025

FORM SIDE WALL INTERCONNECTS / PACKAGE INTERCONNECTS — 1030

COUPLE TO SUBSTRATE — 1035

COUPLE PACKAGE TO BOARD AND COUPLE CONNECTOR TO PACKAGE — 1040

*FIG. 10*

PACKAGE COMPRISING SIDEWALL INTERCONNECTS CONFIGURED FOR POWER ROUTING

FIELD

Various features relate to a package comprising an integrated device.

BACKGROUND

A package may include a substrate and integrated devices. These components are coupled together to provide a package that may perform various functions. The performance of a package and its components may depend on many factors. There is an ongoing need to provide packages that provide improved performances. Moreover, there is an ongoing need to include a package that includes a more compact form factor so that the package may be implemented in smaller devices.

SUMMARY

Various features relate to a package comprising an integrated device.

One example provides a device comprising a package. The package comprises a package substrate; a first integrated device coupled to the package substrate through a first plurality of bump interconnects; an encapsulation layer at least partially encapsulating the first integrated device; a plurality of post interconnects located in the encapsulation layer; a metallization portion coupled to the plurality of post interconnects; a second integrated device coupled to the metallization portion through a second plurality of bump interconnects; and a plurality of side wall interconnects coupled to the encapsulation layer and the metallization portion.

Another example provides a device comprising a package. The package comprises a package substrate; a first integrated device coupled to the package substrate through a first plurality of bump interconnects; an encapsulation layer at least partially encapsulating the first integrated device; a plurality of post interconnects located in the encapsulation layer; a metallization portion coupled to the plurality of post interconnects; a second integrated device coupled to the metallization portion through a second plurality of bump interconnects; and a plurality of package interconnects coupled to the encapsulation layer and the metallization portion, wherein the plurality of package interconnects are embedded in the encapsulation layer.

BRIEF DESCRIPTION OF THE DRAWINGS

Various features, nature and advantages may become apparent from the detailed description set forth below when taken in conjunction with the drawings in which like reference characters identify correspondingly throughout.

FIGS. 9A-9E illustrate an exemplary sequence for fabricating and assembling a package and a connector.

FIG. 10 illustrates an exemplary flow diagram of a method fabricating and assembling a package and a connector.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a package. The package comprises a package substrate; a first integrated device coupled to the package substrate through a first plurality of bump interconnects; an encapsulation layer at least partially encapsulating the first integrated device; a plurality of post interconnects located in the encapsulation layer; a metallization portion coupled to the plurality of post interconnects; a second integrated device coupled to the metallization portion through a second plurality of bump interconnects; and a plurality of side wall interconnects coupled to the encapsulation layer and the metallization portion. The device may also include a connector coupled to the package through a third plurality of bump interconnects. The connector is configured to provide at least one electrical path for power to the package. The connector is configured to provide at least one electrical path for ground to the package. In some implementations, the connector is configured to provide (i) a first electrical path for a first power to the package and (ii) a second electrical path for a second power to the package. In some implementations, the power to the package is provided through the plurality of side wall interconnects of the package, which can help provide one or more direct electrical paths to the first integrated device and/or the second integrated device. This can help improve the performance of the power distribution network of the package, which can help improve the performance of the package, the first integrated device and/or the second integrated device.

Exemplary Device Comprising a Package and a Connector

Figure 1:
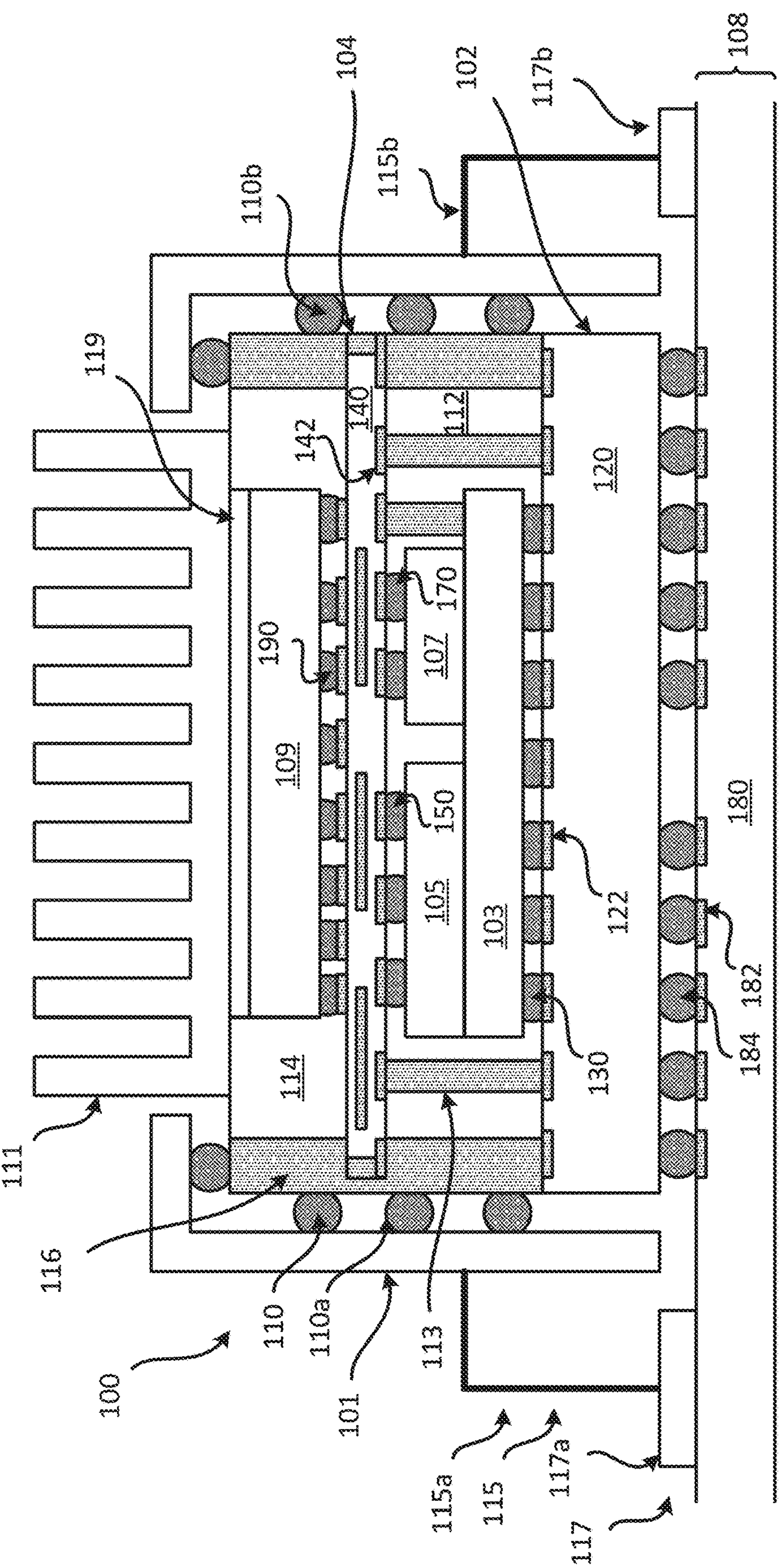
FIG. 1 illustrates a cross sectional profile view of an exemplary package and a connector.

FIG. 1 illustrates a cross sectional profile view of a package 100 that includes side wall interconnects. The package 100 is configured to be coupled to a connector 101. The connector 101 is configured to provide at least one electrical path for power to the package 100. The package 100 includes a substrate 102 (e.g., package substrate), a metallization portion 104, an integrated device 103, an integrated device 105, an integrated device 107 and integrated device 109, an encapsulation layer 112, an encapsulation layer 114, and a plurality of side wall interconnects 116. The package 100 may also include a heat sink 111.

The package 100 is coupled to a board 108 through a plurality of solder interconnects 184. The board 108 may include a printed circuit board (PCB). The board 108 includes at least one board dielectric layer 180 and a plurality of board interconnects 182. The plurality of solder interconnects 184 are coupled to the plurality of board interconnects 182. The substrate 102 includes at least one dielectric layer 120 and a plurality of interconnects 122 (e.g., substrate interconnects). The plurality of solder interconnects 184 are coupled to the plurality of interconnects 122. The substrate 102 is coupled to the board 108 through the plurality of solder interconnects 184.

The integrated device 103 is coupled to the substrate 102 through a plurality of bump interconnects 130. A front side of the integrated device 103 may face a surface of the substrate 102. The integrated device 105 and/or the integrated device 107 may be coupled to the integrated device 103. For example, a back side of the integrated device 105 may be coupled to a back side of the integrated device 103. In some implementations, the back side of the integrated device 105 may be touching the back side of the integrated device 103. In some implementations, a bump interconnect (e.g., micro bump interconnect) or a hybrid bump interconnect may be used to couple the back side of the integrated device 105 to the back side of the integrated device 103. A back side of the integrated device 107 may be coupled to a back side of the integrated device 103. In some implementations, the back side of the integrated device 107 may be touching the back side of the integrated device 103. In some implementations, a bump interconnect (e.g., micro bump interconnect) or a hybrid bump interconnect may be used to couple the back side of the integrated device 107 to the back side of the integrated device 103. Bump interconnects may include pillar interconnects and/or solder interconnects. Hybrid bump interconnects may be direct bump to bump interconnects (e.g., pillar interconnect to pillar interconnect coupling, copper to copper bonding).

The encapsulation layer 112 may at least partially encapsulate the integrated device 103, the integrated device 105 and/or the integrated device 107. The encapsulation layer 112 may include a mold, a resin and/or an epoxy. A compression molding process, a transfer molding process, or a liquid molding process may be used to form the encapsulation layer 112. A plurality of post interconnects 113 (e.g., through mold vias) may be located in the encapsulation layer 112. The encapsulation layer 112 may at least partially encapsulate the plurality of post interconnects 113. The encapsulation layer 112 may also at least partially encapsulate the plurality of bump interconnects 130, the plurality of bump interconnects 150 and/or the plurality of bump interconnects 170.

The metallization portion 104 is coupled to the encapsulation layer 112 and the plurality of post interconnects 113. The metallization portion 104 includes at least one dielectric layer 140 and a plurality of metallization interconnects 142. The metallization portion 104 may be a redistribution portion. The plurality of metallization interconnects 142 may include redistribution interconnects. In some implementations, at least some post interconnects from the plurality of post interconnects 113 are coupled to (i) metallization interconnects from the plurality of metallization interconnects 142 of the metallization portion 104, and (ii) interconnects from the plurality of interconnects 122 of the substrate 102. In some implementations, at least some interconnects from the plurality of post interconnects 113 may be coupled to (i) metallization interconnects from the plurality of metallization interconnects 142 of the metallization portion 104, and (ii) the integrated device 103 (e.g., back side of the integrated device 103).

The integrated device 105 is coupled to the metallization portion 104 through a plurality of bump interconnects 150. The plurality of bump interconnects 150 may be coupled to metallization interconnects from the plurality of metallization interconnects 142 of the metallization portion 104. The front side of the integrated device 105 may face the metallization portion 104. The integrated device 107 is coupled to the metallization portion 104 through a plurality of bump interconnects 170. The plurality of bump interconnects 170 may be coupled to metallization interconnects from the plurality of metallization interconnects 142 of the metallization portion 104. The front side of the integrated device 107 may face the metallization portion 104. In some implementations, the plurality of bump interconnects 130, the plurality of bump interconnects 150 and/or the plurality of bump interconnects 170 may include a plurality of micro bump interconnects. A micro bump interconnect may be similar to a bump interconnect. However, the micro bump interconnect may have smaller dimensions than a bump interconnect, to accommodate finer interconnect pitches. In some implementations, the plurality of bump interconnects 130, the plurality of bump interconnects 150 and/or the plurality of bump interconnects 170, may have smaller dimensions (e.g., width, diameters) than the dimensions of the plurality of solder interconnects 110 and/or the plurality of solder interconnects 184. In some implementations, one or more bump interconnects may have a pitch (e.g., minimum pitch) in a range of about 80-120 micrometers. In some implementations, one or more micro bump interconnects may have a pitch (e.g., minimum pitch) in a range of about 25-50 micrometers.

The integrated device 103, the integrated device 105, the integrated device 107, the encapsulation layer 112 and the plurality of post interconnects 113 are located between the substrate 102 and the metallization portion 104.

The integrated device 109 is coupled to the metallization portion 104 through a plurality of bump interconnects 190. The plurality of bump interconnects 190 may be coupled to metallization interconnects of the plurality of metallization interconnects 142 of the metallization portion 104. An encapsulation layer 114 may be coupled to a first surface of the metallization portion 104. The encapsulation layer 114 may at least partially encapsulate the integrated device 109. The front side of the integrated device 109 may face a first surface (e.g., top surface) of the metallization portion 104. The front side of the integrated device 105 may face a second surface (e.g., bottom surface) of the metallization portion 104. Similarly, the front side of the integrated device 107 may face a second surface (e.g., bottom surface) of the metallization portion 104.

The package 100 may include a plurality of side wall interconnects 116. The plurality of side wall interconnects 116 may be located on a side portion of the package 100. The plurality of side wall interconnects 116 may be embedded in a side portion of the package 100. The plurality of side wall interconnects 116 may be coupled to and/or embedded in the encapsulation layer 114, the metallization portion 104, and/or the encapsulation layer 112. As will be further describe below, the plurality of side wall interconnects 116 may travel vertically, horizontally, and/or diagonally along a side portion (e.g., side wall, side surface) of the package 100. The plurality of side wall interconnects 116 may be coupled to (i) metallization interconnects from the plurality of metallization interconnects 142, and/or (ii) post interconnects from the plurality of post interconnects 113.

The heat sink 111 is coupled to the back side of the integrated device 109 through a thermal interface material 119. The heat sink 111 may be located over the integrated device 109 and the encapsulation layer 114.

The connector 101 is configured to be coupled to the package 100 through a plurality of solder interconnects 110. The plurality of solder interconnects 110 may be coupled to top portions and/or side portions of the plurality of side wall interconnects 116. The connector 101 may be a package connector. The connector 101 includes a body (e.g., casing) and a plurality of interconnects located in the body (not shown). The connector 101 is coupled to a plurality of wires 115. The plurality of wires 115 are coupled to a plurality of board connectors 117. Each board connector from the plurality of board connectors 117 may each include a body (e.g., casing) and a plurality of interconnects. A board connector from the plurality of board connectors 117 may include a socket or a plug. The plurality of board connectors 117 may be configured to be coupled to the board 108 through a plurality of board based connectors (not shown). The board based connectors may be coupled to the board 108. In some implementations, the plurality of board connectors 117 may include a plug and the board based connectors may include a socket. In some implementations, the plurality of board connectors 117 may include a socket and the board based connectors may include a plug. It is noted that the plurality of solder interconnects 110 may be implemented as a plurality of bump interconnects. A bump interconnect may include a pillar interconnect and a solder interconnect. Thus, in some implementations, the connector 101 may be coupled to a package through a plurality of bump interconnects, instead of or in conjunction with the plurality of solder interconnects 110.

In some implementations, one or more power may be provided to the package 100, through the plurality of board connectors 117, the plurality of wires 115, the connector 101 and the plurality of solder interconnects 110. As will be further described below, the use of the connector 101 may provide a more efficient and direct path for power to the various components of the package 100, which can result in improved performance of the package 100, the integrated device 103, the integrated device 105, the integrated device 107 and/or the integrated device 109.

In some implementations, an electrical path (e.g., for power) between the board 108 and the integrated device 103 may include (i) at least one interconnect from the plurality of board connectors (e.g., 117, 117*a*, 117*b*), (ii) a least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one side wall interconnect from the plurality of side wall interconnects 116, (vi) at least one interconnect from the plurality of interconnects 122, and (vii) at least one bump interconnect from the plurality of bump interconnects 130.

In some implementations, an electrical path (e.g., for power) between the board 108 and the integrated device 105 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101. (iv) at least one solder interconnect from the plurality of solder interconnects (e.g., 110, 110*a*, 110*b*), (*v*) at least one side wall interconnect from the plurality of side wall interconnects 116, (vi) at least one metallization interconnect from the plurality of metallization interconnects 142, and (vii) at least one bump interconnect from the plurality of bump interconnects 150.

In some implementations, an electrical path (e.g., for power) between the board 108 and the integrated device 107 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one side wall interconnect from the plurality of side wall interconnects 116, (vi) at least one metallization interconnect from the plurality of metallization interconnects 142, and (vii) at least one bump interconnect from the plurality of bump interconnects 170.

In some implementations, an electrical path (e.g., for power) between the board 108 and the integrated device 109 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one side wall interconnect from the plurality of side wall interconnects 116, (vi) at least one metallization interconnect from the plurality of metallization interconnects 142, and (vii) at least one bump interconnect from the plurality of bump interconnects 190.

In some implementations, ground may travel between the board 108 and one or more integrated devices (e.g., 103, 105, 107, 109) of the package 100 in a similar manner as that described for power. In some implementations, the integrated devices of the package 100 may share the same power. In some implementations, two or more integrated devices of the package 100 may share the same power. In some implementations, two or more integrated devices of the package 100 may use different power (e.g., different voltage, different current). For example, in some implementations, the connector 101 may be configured to provide a first electrical path for a first power, a second electrical path for a second power, a third electrical path for a third power, and/or another electrical path for ground. The interconnects of the connector 101, the plurality of wires 115 and/or the plurality of board connectors 117 may provide less resistance than interconnects from the substrate 102, resulting in a lower IR drop to the integrated devices of the package 100. It is noted that in some implementations, power and/or ground may travel between the board 108 and the package 100, through one or more electrical paths that include a board interconnect from the plurality of board interconnects 182, a solder interconnect from the plurality of solder interconnects 184 and an interconnect from the plurality of interconnects 122. It is noted that the electrical paths described in the disclosure are exemplary. In some implementations, other electrical paths may be used to provide power and/or ground to the various integrated devices.

Figure 2:
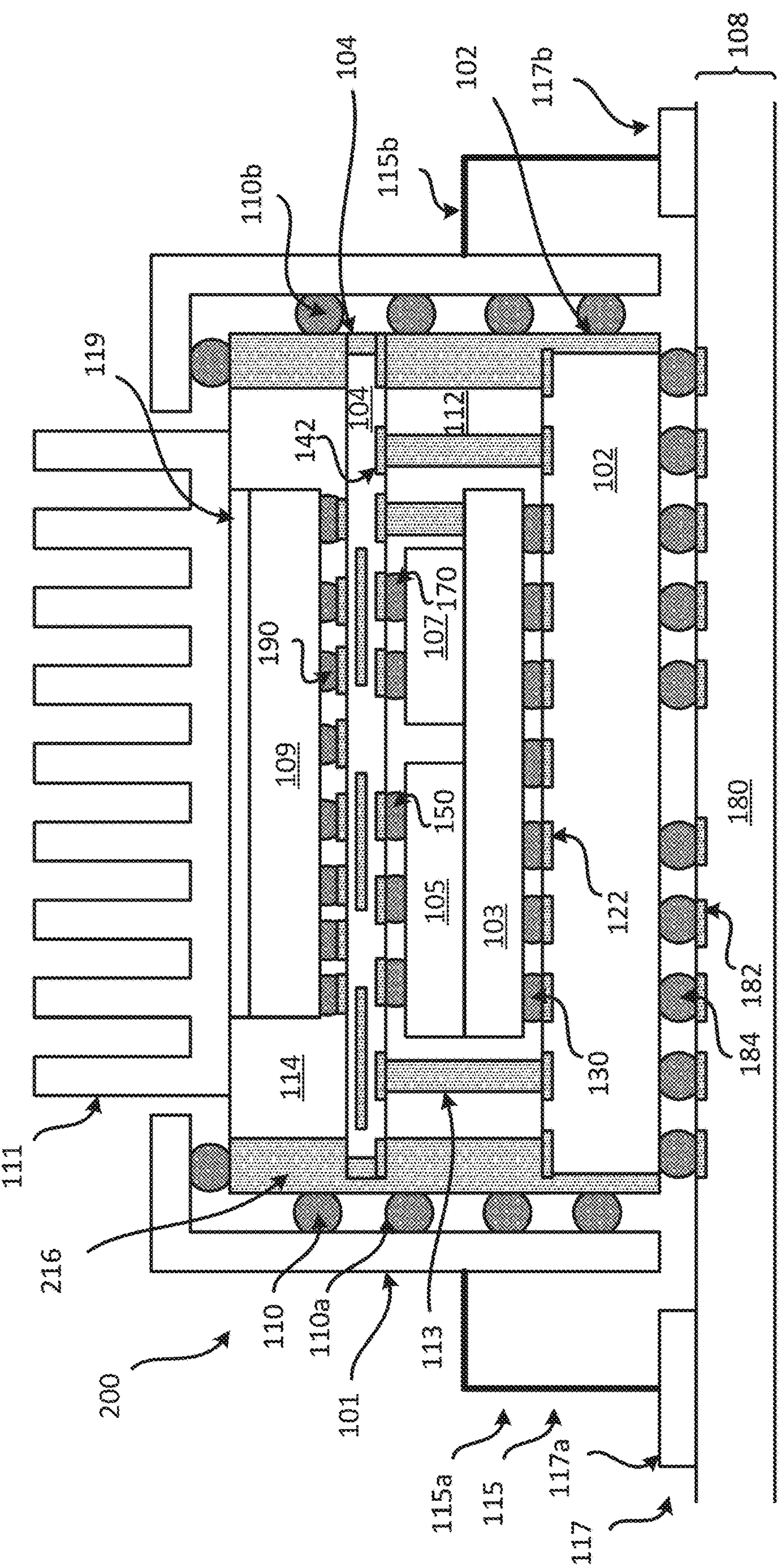
FIG. 2 illustrates a cross sectional profile view of an exemplary package and a connector.

FIG. 2 illustrates a package 200 with another configuration of a plurality of side wall interconnects. The package 200 is similar to the package 100 of FIG. 1, and may be configured in a similar matter as the package 100. The package 200 is configured to be coupled to the connector 101. The connector 101 is configured to provide at least one electrical path for power to the package 200. The package 200 includes a substrate 102 (e.g., package substrate), a metallization portion 104, an integrated device 103, an integrated device 105, an integrated device 107 and integrated device 109, an encapsulation layer 112, an encapsulation layer 114, and a plurality of side wall interconnects 216.

As mentioned above, the package 200 may include a plurality of side wall interconnects 216. The plurality of side wall interconnects 216 may be located on a side portion of the package 200. The plurality of side wall interconnects 216 may be located on side portion and/or embedded in a side portion of the package 200. The plurality of side wall interconnects 216 may be coupled to and/or embedded in part of the encapsulation layer 114, the metallization portion 104, the encapsulation layer 112 and/or the substrate 102. The plurality of side wall interconnects 216 may travel vertically, horizontally, and/or diagonally along a side portion (e.g., side wall, side surface) of the package 200. The plurality of side wall interconnects 216 may be coupled to (i) metallization interconnects from the plurality of metallization interconnects 142, (ii) post interconnects from the plurality of post interconnects 113, and/or interconnects from the plurality of interconnects 122. The plurality of solder interconnects 110 may be coupled to top portions and/or side portions of the plurality of side wall interconnects 216.

In some implementations, an electrical path (e.g., for power) between the board 108 and the integrated device 103 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101. (iv) at least one solder interconnect from the plurality of solder interconnects (e.g., 110, 110*a*, 110*b*), (*v*) at least one side wall interconnect from the plurality of side wall interconnects 216, (vi) at least one interconnect from the plurality of interconnects 122, and (vii) at least one bump interconnect from the plurality of bump interconnects 130.

In some implementations, an electrical path (e.g., for power) between the board 108 and the integrated device 105 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101. (iv) at least one solder interconnect from the plurality of solder interconnects (e.g., 110, 110*a*, 110*b*), (*v*) at least one side wall interconnect from the plurality of side wall interconnects 216, (vi) at least one metallization interconnect from the plurality of metallization interconnects 142, and (vii) at least one bump interconnect from the plurality of bump interconnects 150.

In some implementations, an electrical path (e.g., for power) between the board 108 and the integrated device 107 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one side wall interconnect from the plurality of side wall interconnects 216, (vi) at least one metallization interconnect from the plurality of metallization interconnects 142, and (vii) at least one bump interconnect from the plurality of bump interconnects 170.

In some implementations, an electrical path (e.g., for power) between the board 108 and the integrated device 109 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one side wall interconnect from the plurality of side wall interconnects 216, (vi) at least one metallization interconnect from the plurality of metallization interconnects 142, and (vii) at least one bump interconnect from the plurality of bump interconnects 190.

In some implementations, ground may travel between the board 108 and one or more integrated devices (e.g., 103, 105, 107, 109) of the package 200 in a similar manner as that described for power. In some implementations, the integrated devices of the package 200 may share the same power. In some implementations, two or more integrated devices of the package 200 may share the same power. In some implementations, two or more integrated devices of the package 200 may use different power (e.g., different voltage, different current). It is noted that in some implementations, power and/or ground may travel between the board 108 and the package 200, through one or more electrical paths that includes a board interconnect from the plurality of board interconnects 182, a solder interconnect from the plurality of solder interconnects 184 and an interconnect from the plurality of interconnects 122. It is noted that the electrical paths described in the disclosure are exemplary. In some implementations, other electrical paths may be used to provide power and/or ground to the various integrated devices.

Figure 3:
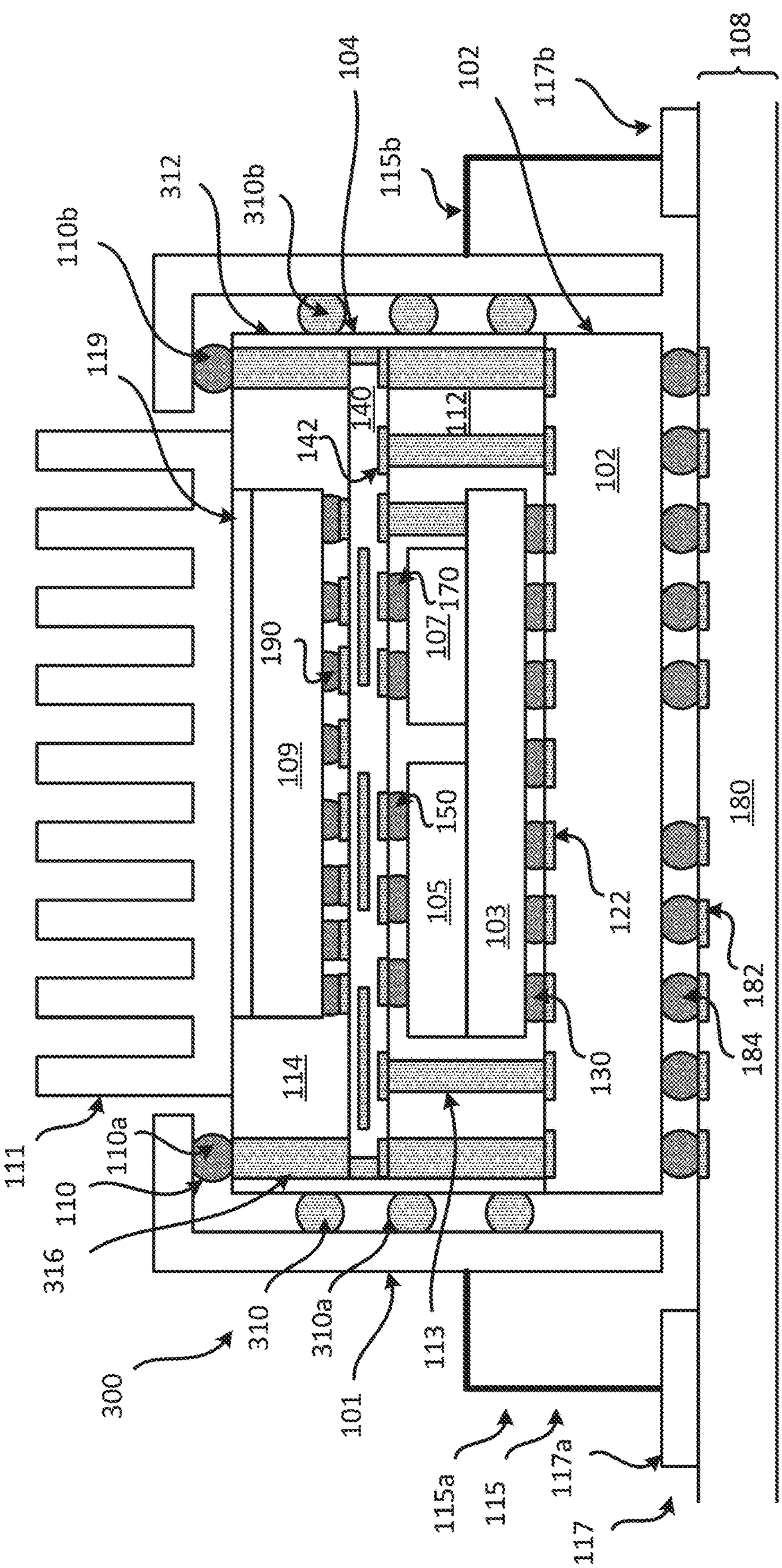
FIG. 3 illustrates a cross sectional profile view of an exemplary package and a connector.

FIG. 3 illustrates a package 300 with a configuration of a plurality of package interconnects. The package 300 is similar to the package 100 of FIG. 1, and may be configured in a similar matter as the package 100. The package 300 is configured to be coupled to a connector 101. The connector 101 is configured to provide at least one electrical path for power to the package 300. The package 300 includes a substrate 102 (e.g., package substrate), a metallization portion 104, an integrated device 103, an integrated device 105, an integrated device 107 and integrated device 109, an encapsulation layer 112, an encapsulation layer 114, a plurality of package interconnects 316, and an encapsulation layer 312. The encapsulation layer 312 may touch the plurality of package interconnects 316, the encapsulation layer 112, the encapsulation layer 114, and the metallization portion 104. The encapsulation layer 312 may laterally surround the plurality of package interconnects 316, the encapsulation layer 112, the encapsulation layer 114, and the metallization portion 104. The encapsulation layer 312 may cover the laterally surfaces of the plurality of package interconnects 316. In some implementations, the encapsulation layer 312, the encapsulation layer 114 and/or the encapsulation layer 112 may considered part of the same encapsulation layer.

As mentioned above, the package 300 may include a plurality of package interconnects 316. The plurality of package interconnects 316 may be embedded along a side portion of the package 300. The plurality of package interconnects 316 may be embedded along a periphery of the package 300. The plurality of package interconnects 316 may be coupled to and/or embedded in part of the encapsulation layer 312, the encapsulation layer 114, the metallization portion 104, and/or the encapsulation layer 112. The plurality of package interconnects 316 may travel vertically, horizontally, and/or diagonally along inside a portion (e.g., package) of the package 300. The plurality of package interconnects 316 may be coupled to (i) metallization interconnects from the plurality of metallization interconnects 142, and/or (ii) post interconnects from the plurality of post interconnects 113.

The connector 101 is configured to be mechanically and electrically coupled to the package through a plurality of solder interconnects 110 (e.g., 110*a*, 110*b*). The plurality of solder interconnects 110 may be coupled to top portions of the plurality of package interconnects 316. The connector 101 is configured to be mechanically coupled to the package through a plurality of adhesive connections 310 (e.g., 310*a*, 310*b*). The plurality of adhesive connections 310 may be coupled to the encapsulation layer 312. No electrical current may pass through to the package 300 through the plurality of adhesive connections 310. The plurality of adhesive connections 310 may help provide mechanical adhesion between the connector 101 and the package 300.

In some implementations, an electrical path (e.g., for power) between the board 108 and the integrated device 103 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one interconnect from the plurality of interconnects 122, and (vii) at least one bump interconnect from the plurality of bump interconnects 130.

In some implementations, an electrical path (e.g., for power) between the board 108 and the integrated device 103 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one metallization interconnect from the plurality of metallization interconnects 142. (vii) at least one post interconnect from the plurality of post interconnects 113, (viii) at least one interconnect from the plurality of interconnects 122, and (ix) at least one bump interconnect from the plurality of bump interconnects 130. In some implementations, a package interconnect may include a metallization interconnect, and a post interconnect.

In some implementations, an electrical path (e.g., for power) between the board 108 and the integrated device 105 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one metallization interconnect from the plurality of metallization interconnects 142, and (vii) at least one bump interconnect from the plurality of bump interconnects 150.

In some implementations, an electrical path (e.g., for power) between the board 108 and the integrated device 107 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one metallization interconnect from the plurality of metallization interconnects 142, and (vii) at least one bump interconnect from the plurality of bump interconnects 170.

In some implementations, an electrical path (e.g., for power) between the board 108 and the integrated device 109 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one metallization interconnect from the plurality of metallization interconnects 142, and (vii) at least one bump interconnect from the plurality of bump interconnects 190.

In some implementations, ground may travel between the board 108 and one or more integrated devices (e.g., 103, 105, 107, 109) of the package 300 in a similar manner as that described for power. In some implementations, the integrated devices of the package 300 may share the same power. In some implementations, two or more integrated devices of the package 300 may share the same power. In some implementations, two or more integrated devices of the package 300 may use different power (e.g., different voltage, different current).

Figure 4:
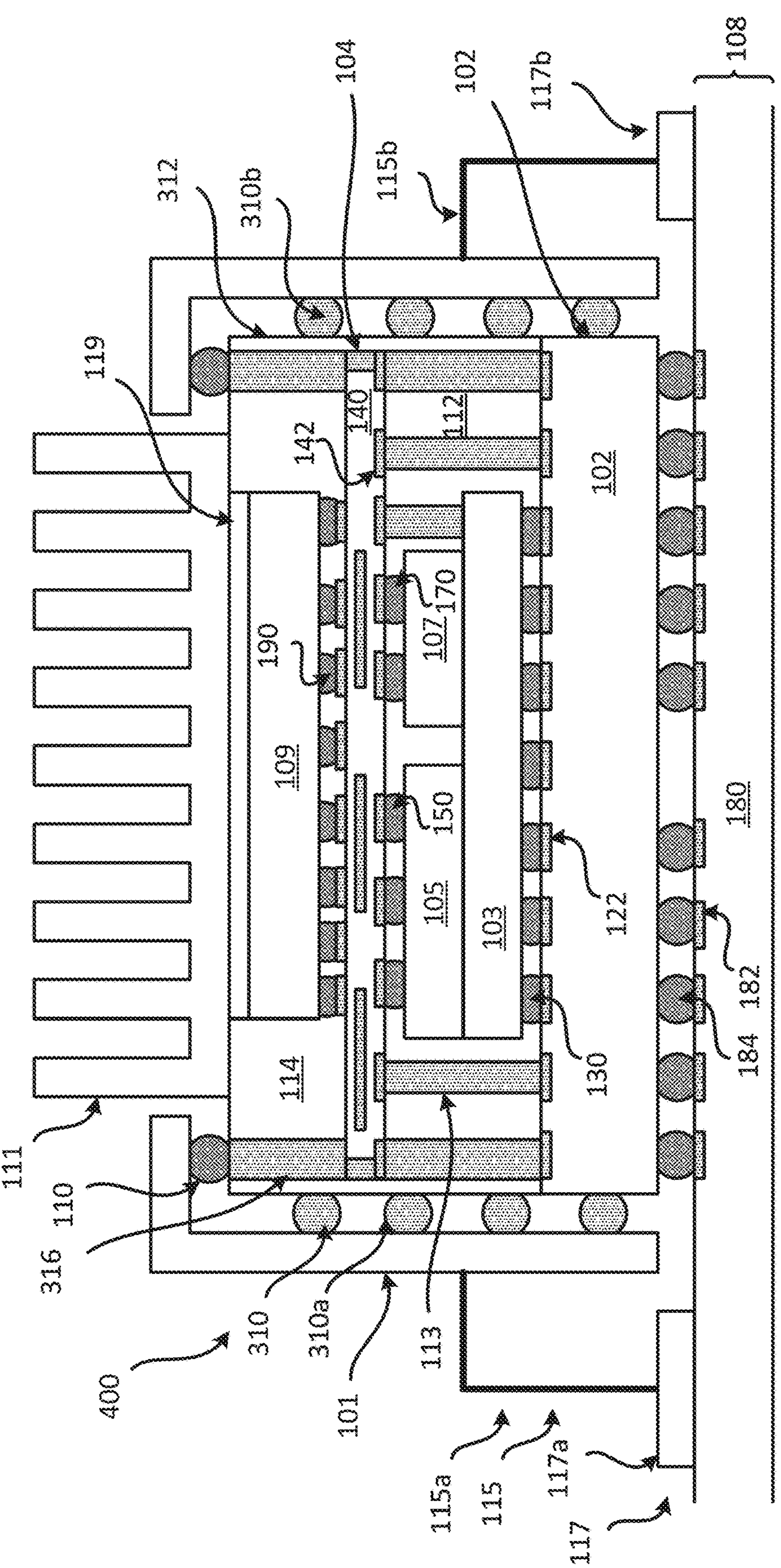
FIG. 4 illustrates a cross sectional profile view of an exemplary package an a connector.

FIG. 4 illustrates a package 400 with a configuration of a plurality of package interconnects. The package 400 is similar to the package 300 of FIG. 3, and may be configured in a similar matter as the package 300. The package 400 is configured to be coupled to a connector 101. The connector 101 is configured to provide at least one electrical path for power to the package 400. The package 400 includes a substrate 102 (e.g., package substrate), a metallization portion 104, an integrated device 103, an integrated device 105, an integrated device 107 and integrated device 109, an encapsulation layer 112, an encapsulation layer 114, and a plurality of package interconnects 316. The encapsulation layer 312 may cover the laterally surfaces of the plurality of package interconnects 316. In some implementations, the encapsulation layer 312, the encapsulation layer 114 and/or the encapsulation layer 112 may considered part of the same encapsulation layer.

As mentioned above, the package 400 may include a plurality of package interconnects 316. The plurality of package interconnects 316 may be embedded along a side portion of the package 400. The plurality of package interconnects 316 may be coupled to and/or part of the encapsulation layer 312, the encapsulation layer 114, the metallization portion 104, and/or the encapsulation layer 112. The plurality of package interconnects 316 may travel vertically, horizontally, and/or diagonally along an inside portion (e.g., package) of the package 400. The plurality of package interconnects 316 may be coupled to (i) metallization interconnects from the plurality of metallization interconnects 142, and/or (ii) post interconnects from the plurality of post interconnects 113.

The connector 101 is configured to be mechanically and electrically coupled to the package through a plurality of solder interconnects 110 (e.g., 110*a*, 110*b*). The plurality of solder interconnects 110 may be coupled to top portions of the plurality of package interconnects 316. The connector 101 is configured to be mechanically coupled to the package through a plurality of adhesive connections 310 (e.g., 310*a*, 310*b*). The plurality of adhesive connections 310 may be coupled to the encapsulation layer 312 and/or the substrate 102. No electrical current may pass through to the package 400 through the plurality of adhesive connections 310. The plurality of adhesive connections 310 may help provide mechanical adhesion between the connector 101 and the package 400.

In some implementations, an electrical path (e.g., for power) between the board 108 and the integrated device 103 may include (i) at least one interconnect from the plurality of board connectors (e.g., 117, 117*a*, 117*b*), (ii) at least one wire from the plurality of wires (e.g., 115, 115*a*. 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one interconnect from the plurality of interconnects 122, and (vii) at least one bump interconnect from the plurality of bump interconnects 130.

In some implementations, an electrical path (e.g., for power) between the board 108 and the integrated device 103 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*. 110*b*), (*v*) at least one package interconnect from the plurality of package interconnects 316, (vi) at least one metallization interconnect from the plurality of metallization interconnects 142, (vii) at least one post interconnect from the plurality of post interconnects 113. (viii) at least one interconnect from the plurality of interconnects 122, and (ix) at least one bump interconnect from the plurality of bump interconnects 130. In some implementations, a package interconnect may include a metallization interconnect, and a post interconnect.

In some implementations, an electrical path (e.g., for power) between the board 108 and the integrated device 105 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one metallization interconnect from the plurality of metallization interconnects 142, and (vii) at least one bump interconnect from the plurality of bump interconnects 150.

In some implementations, an electrical path (e.g., for power) between the board 108 and the integrated device 107 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one metallization interconnect from the plurality of metallization interconnects 142, and (vii) at least one bump interconnect from the plurality of bump interconnects 170.

In some implementations, an electrical path (e.g., for power) between the board 108 and the integrated device 109 may include (i) at least one interconnect from the plurality of board connectors (e.g., 117, 117*a*, 117*b*), (ii) at least one wire from the plurality of wires (e.g., 115, 115*a*, 115*b*), (iii) at least one interconnect from the connector 101, (iv) at least one solder interconnect from the plurality of solder interconnects (e.g., 110, 110*a*, 110*b*), (*v*) at least one package interconnect from the plurality of package interconnects 316, (vi) at least one metallization interconnect from the plurality of metallization interconnects 142, and (vii) at least one bump interconnect from the plurality of bump interconnects 190.

In some implementations, ground may travel between the board 108 and one or more integrated devices (e.g., 103, 105, 107, 109) of the package 400 in a similar manner as that described for power. In some implementations, the integrated devices of the package 400 may share the same power. In some implementations, two or more integrated devices of the package 400 may share the same power. In some implementations, two or more integrated devices of the package 400 may use different power (e.g., different voltage, different current).

In some implementations, the integrated device 103 may include a central process unit (CPU) or a graphical process unit (GPU). In some implementations, the integrated device 105 may include memory. In some implementations, the integrated device 107 may include memory. In some implementations, the integrated device 109 may include a central process unit (CPU) or a graphical process unit (GPU). The connector 101 may have different heights. In some implementations, the connector 101 may have a height in a range of about 1-2 millimeters (mm).

Figure 5:
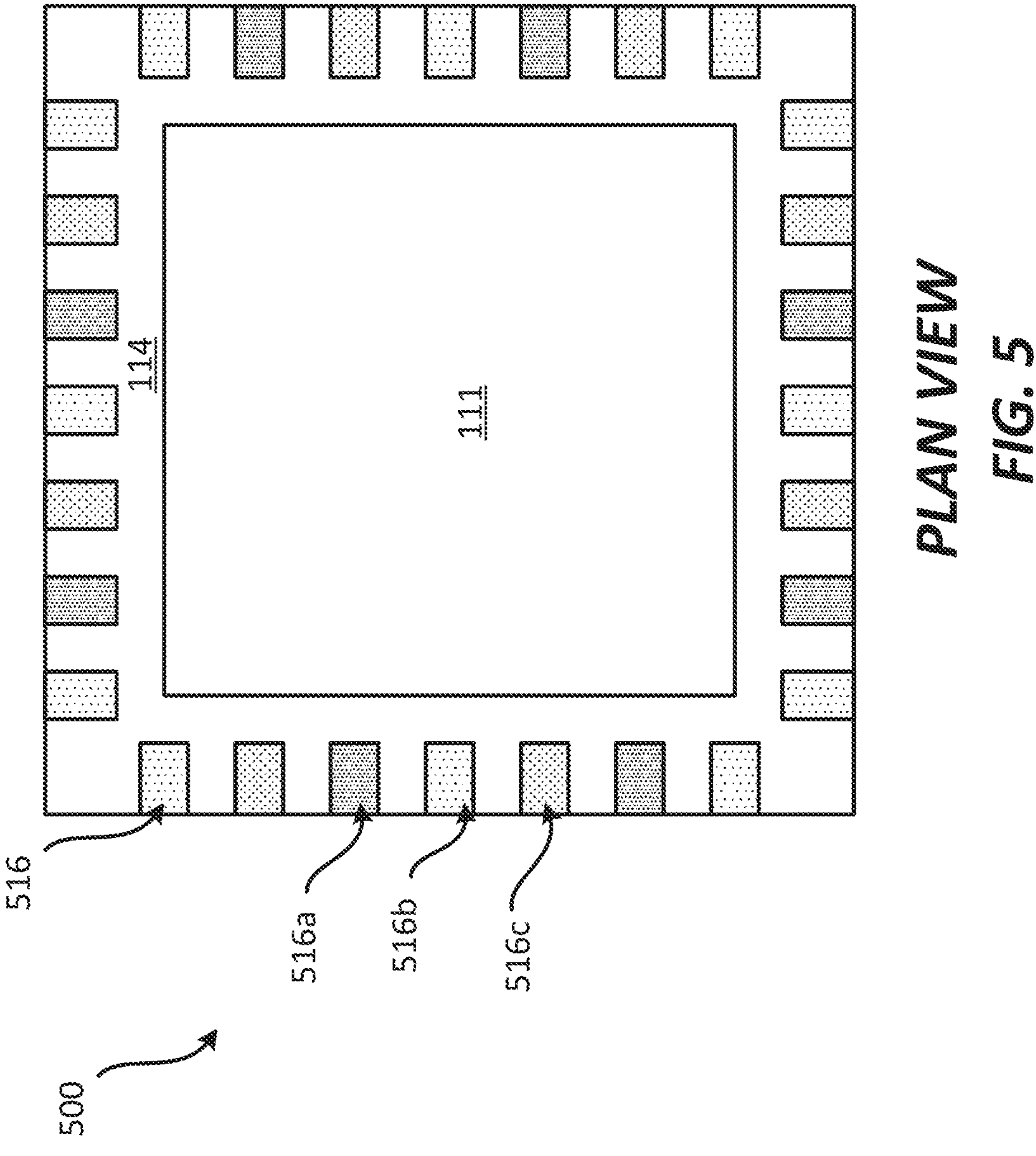
FIG. 5 illustrates a plan view of an exemplary package.

FIG. 5 illustrates a plan view of the package 500. The package 500 may represent the package 100, the package 200, the package 300 and/or the package 400. The package 500 may include the same components as the package 100, the package 200, the package 300 and/or the package 400. The package 500 includes the heat sink 111, the encapsulation layer 114 and a plurality of side wall interconnects 516. The plurality of side wall interconnects 516 may represent the plurality of side wall interconnects 116 and/or the plurality of side wall interconnects 216. In some implementations, the plurality of side wall interconnects 516 may be implemented as a plurality of package interconnects 316 in a package.

The plurality of side wall interconnects 516 include a plurality of side wall interconnects 516*a*, a plurality of side wall interconnects 516*b* and a plurality of side wall interconnects 516*c*. In some implementations, the plurality of side wall interconnects 516*a* (e.g., first plurality of side wall interconnects) may be configured to provide one or more first electrical paths for a first power. In some implementations, the plurality of side wall interconnects 516*b* (second plurality of side wall interconnects) may be configured to provide one or more second electrical paths for a second power. In some implementations, the plurality of side wall interconnects 516*c* (e.g., third plurality of side wall interconnects) may be configured to provide one or more electrical paths for a ground. The plurality of side wall interconnects 516 may arranged in rows and/or columns along a surface of the package 500. In some implementations, the plurality of side wall interconnects 516 may be embedded in the package 500. Different implementations may have different arrangements and/or routing of the plurality of side wall interconnects 516.

Figure 6:
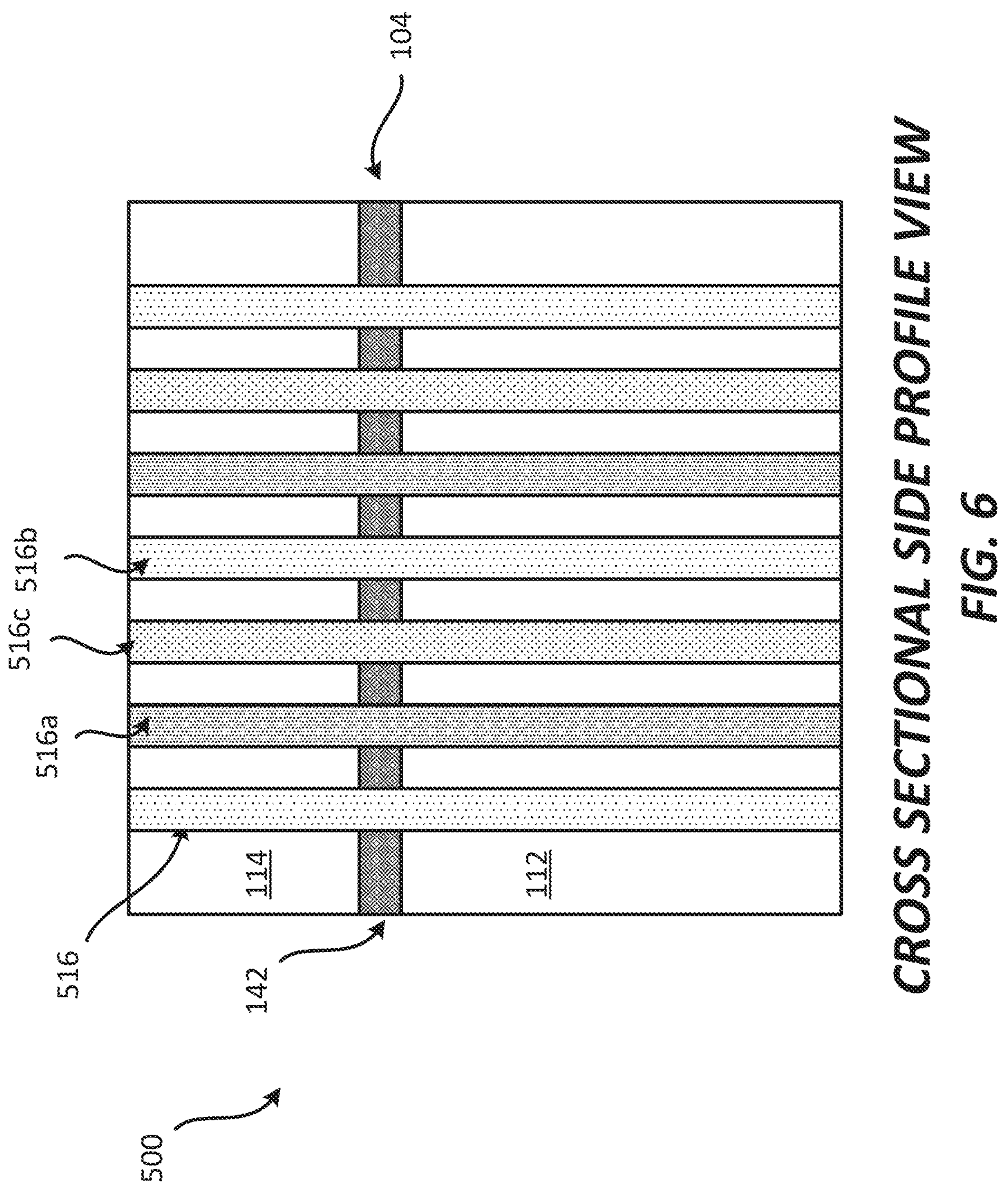
FIG. 6 illustrates a cross sectional profile view of an exemplary package.

FIG. 6 illustrates an exemplary cross sectional profile view of the package 500. The package 500 includes the encapsulation layer 112, the metallization portion 104 and the encapsulation layer 114. The plurality of side wall interconnects 516 may be coupled to the one or more metallization interconnects from the plurality of metallization interconnects 142 of the metallization portion 104. The plurality of side wall interconnects 516 may be touching the one or more metallization interconnects from the plurality of metallization interconnects 142 of the metallization portion 104. Although not shown, in some implementations, the plurality of side wall interconnects 516 may be coupled to interconnects 122 from a substrate 102.

Figure 7:
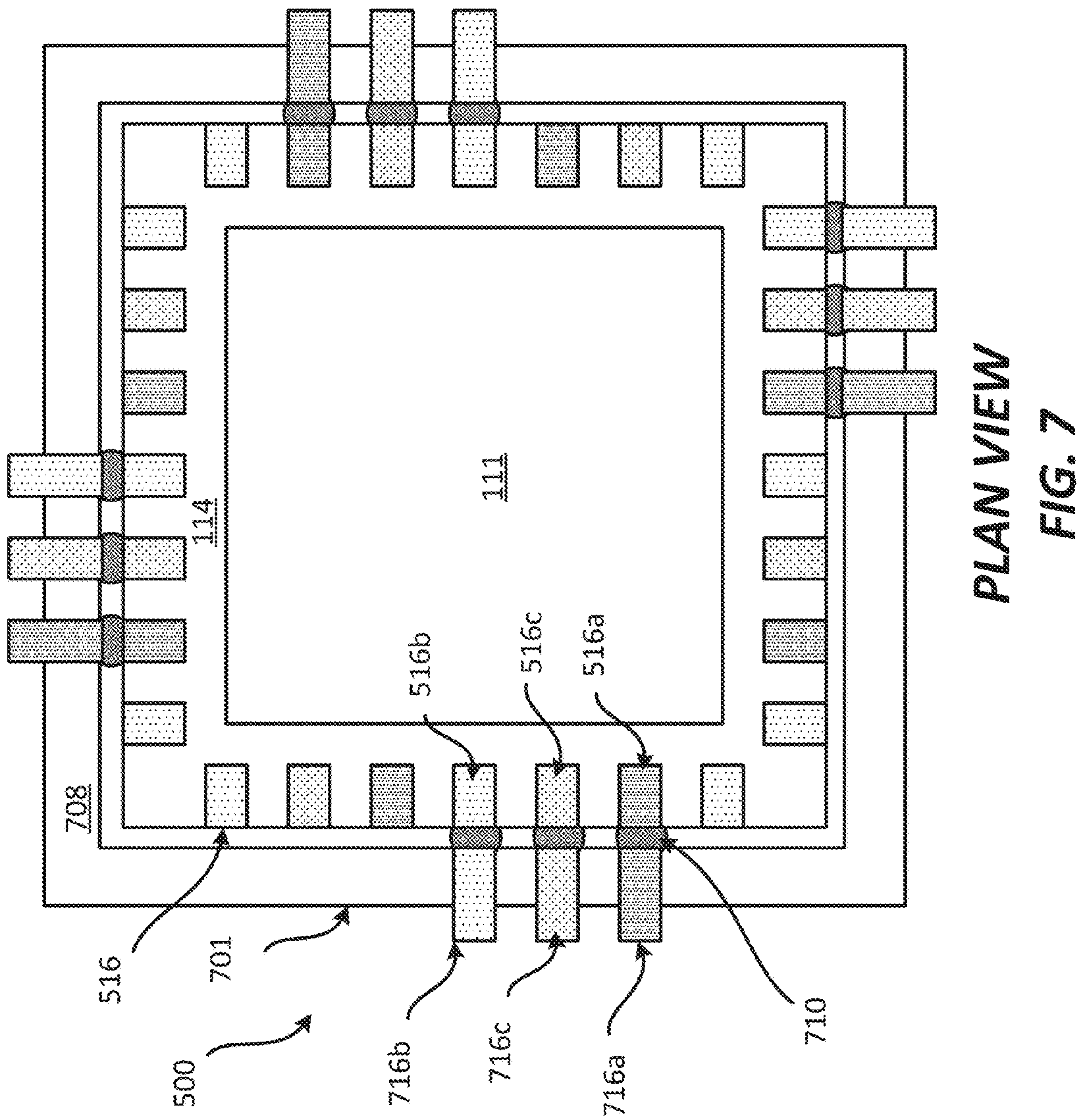
FIG. 7 illustrates a plan view of an exemplary package and a connector.

FIG. 7 illustrates a combination of the package 500 and a connector 701. The connector 701 may represent the connector 101. The connector 701 includes a body 708 and a plurality of interconnects 716 (e.g., connector interconnects). The plurality of interconnects 716 may include a plurality of interconnects 716*a*, a plurality of interconnects 716*b* and a plurality of interconnects 716*c*. The plurality of interconnects 716 may located in the body 708 and/or one or more surfaces of the body 708. The connector 701 laterally surrounds the side surfaces of the package 500. In some implementations, a portion of the connector 701 may also be located over at least a portion of a top surface of the package 500. Different implementations may have different designs for the connector 701. The connector 701 is configured to be mechanically coupled and electrically coupled to the package 500 through the plurality of solder interconnects 710. In some implementations, the plurality of solder interconnects 710 may represent the plurality of solder interconnects 110. The body 708 may include a material that is electrically insulating (e.g., is not electrically conductive).

In some implementations, the plurality of interconnects 716*a* may be coupled to the plurality of side wall interconnects 516*a* through one or more solder interconnects from the plurality of solder interconnects 710. In some implementations, the plurality of interconnects 716*b* may be coupled to the plurality of side wall interconnects 516*b* through one or more solder interconnects from the plurality of solder interconnects 710. In some implementations, the plurality of interconnects 716*c* may be coupled to the plurality of side wall interconnects 516*c* through one or more solder interconnects from the plurality of solder interconnects 710. It is noted that the plurality of solder interconnects 710 may be implemented as a plurality of bump interconnects. A bump interconnect may include a pillar interconnect and a solder interconnect. Thus, in some implementations, the connector 101 may be coupled to a package (e.g., 100, 200, 300, 400, 500) through a plurality of bump interconnects.

Although not shown, there may adhesion connections between the connector 701 and the package 500, configured to provide mechanical coupling between the connector 701 and the package 500, without providing electrical coupling between the connector 701 and the package 500, through the adhesion connections. Examples of such adhesion connections are described above in at least FIGS. 3 and 4.

Figure 8:
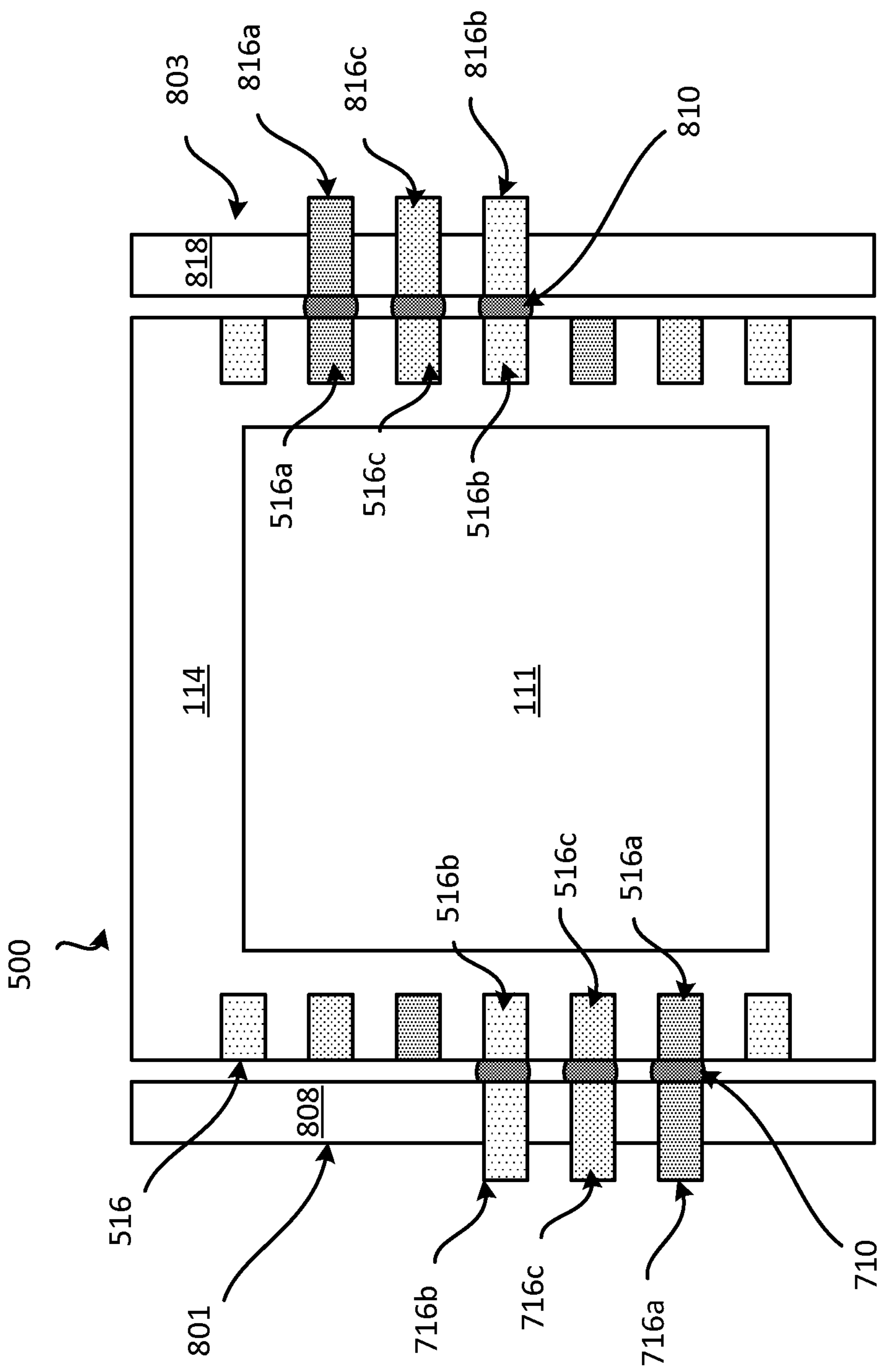
FIG. 8 illustrates a plan view of an exemplary package and a connector.

FIG. 8 illustrates a combination of the package 500, a connector 801 and a connector 803. In some implementations, the connector 801 may represent at least part of the connector 101. The connector 801 includes a body 808 and a plurality of interconnects 716 (e.g., connector interconnects). The plurality of interconnects 716 may include a plurality of interconnects 716*a*, a plurality of interconnects 716*b* and a plurality of interconnects 716*c*. The plurality of interconnects 716 may located in the body 808 and/or one or more surfaces of the body 808. The connector 801 is next to one side surface of the package 500. In some implementations, a portion of the connector 801 may also be located over at least a portion of a top surface of the package 500. Different implementations may have different designs for the connector 801. The connector 801 is configured to be mechanically coupled and electrically coupled to the package 500 through a plurality of solder interconnects 710. The plurality of solder interconnects 710 may represent the plurality of solder interconnects 110.

In some implementations, the plurality of interconnects 716*a* may be coupled to the plurality of side wall interconnects 516*a* through one or more solder interconnects from the plurality of solder interconnects 710. In some implementations, the plurality of interconnects 716*b* may be coupled to the plurality of side wall interconnects 516*b* through one or more solder interconnect from the plurality of solder interconnects 710. In some implementations, the plurality of interconnects 716*c* may be coupled to the plurality of side wall interconnects 516*c* through one or more solder interconnects from the plurality of solder interconnects 710.

Although not shown, there may be adhesion connections between the connector 801 and the package 500, configured to provide mechanical coupling between the connector 801 and the package 500, without providing electrical coupling between the connector 801 and the package 500, through the adhesion connections.

In some implementations, the connector 803 may represent at least part of the connector 101. The connector 803 includes a body 818 and a plurality of interconnects 816 (e.g., connector interconnects). The plurality of interconnects 816 may include a plurality of interconnects 816*a*, a plurality of interconnects 816*b* and a plurality of interconnects 816*c*. The plurality of interconnects 816 may located in the body 818 and/or one or more surfaces of the body 818. The connector 801 is next to another side surface of the package 500. In some implementations, a portion of the connector 801 may also be located over at least a portion of a top surface of the package 500. Different implementations may have different designs for the connector 803. The connector 803 is configured to be mechanically coupled and electrically coupled to the package 500 through a plurality of solder interconnects 810. The plurality of solder interconnects 810 may represent the plurality of solder interconnects 110.

In some implementations, the plurality of interconnects 816*a* may be coupled to the plurality of side wall interconnects 516*a* through one or more solder interconnects from the plurality of solder interconnects 810. In some implementations, the plurality of interconnects 816*b* may be coupled to the plurality of side wall interconnects 516*b* through one or more solder interconnects from the plurality of solder interconnects 810. In some implementations, the plurality of interconnects 816*c* may be coupled to the plurality of side wall interconnects 516*c* through one or more solder interconnects from the plurality of solder interconnects 810. It is noted that the plurality of solder interconnects 810 may be implemented as a plurality of bump interconnects. A bump interconnect may include a pillar interconnect and a solder interconnect. Thus, in some implementations, the connector 101 may be coupled to a package (e.g., 100, 200, 300, 400, 500) through a plurality of bump interconnects.

Although not shown, there may be additional adhesion connections between the connector 803 and the package 500, configured to provide mechanical coupling between the connector 803 and the package 500, without providing electrical coupling between the connector 803 and the package 500, through the adhesion connections.

An integrated device (e.g., 103) may include a die (e.g., semiconductor bare die). The integrated device may include a power management integrated circuit (PMIC). The integrated device may include an application processor. The integrated device may include a modem. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103, 105) may include at least one electronic circuit (e.g., first electronic circuit, second electronic circuit, etc. . . . ). An integrated device may include transistors. An integrated device may be an example of an electrical component and/or electrical device. In some implementations, an integrated device may be a chiplet. In some implementations, an optical integrated device (e.g., 101) may be a chiplet. A chiplet may be fabricated using a process that provides better yields compared to other processes used to fabricate other types of integrated devices, which can lower the overall cost of fabricating a chiplet. Different chiplets may have different sizes and/or shapes. Different chiplets may be configured to provide different functions. Different chiplets may have different interconnect densities (e.g., interconnects with different width and/or spacing). In some implementations, several chiplets may be used to perform the functionalities of one or more chips (e.g., one more integrated devices). Thus, for example, a single integrated device may be split into several chiplets. As mentioned above, using several chiplets that perform several functions may reduce the overall cost of a package relative to using a single chip to perform all of the functions of a package. In some implementations, one or more of the chiplets and/or one or more of integrated devices (e.g., 103) described in the disclosure may be fabricated using the same technology node or two or more different technology nodes. For example, an integrated device may be fabricated using a first technology node, and a chiplet may be fabricated using a second technology node that is not as advanced as the first technology node. In such an example, the integrated device may include components (e.g., interconnects, transistors) that have a first minimum size, and the chiplet may include components (e.g., interconnects, transistors) that have a second minimum size, where the second minimum size is greater than the first minimum size. In some implementations, an integrated device and another integrated device of a package, may be fabricated using the same technology node or different technology nodes. In some implementations, a chiplet and another chiplet of a package, may be fabricated using the same technology node or different technology nodes.

A technology node may refer to a specific fabrication process and/or technology that is used to fabricate an integrated device and/or a chiplet. A technology node may specify the smallest possible size (e.g., minimum size) that can be fabricated (e.g., size of a transistor, width of trace, gap with between two transistors). Different technology nodes may have different yield loss. Different technology nodes may have different costs. Technology nodes that produce components (e.g., trace, transistors) with fine details are more expensive and may have higher yield loss, than a technology node that produces components (e.g., trace, transistors) with details that are less fine. Thus, more advanced technology nodes may be more expensive and may have higher yield loss, than less advanced technology nodes. When all of the functions of a package are implemented in single integrated devices, the same technology node is used to fabricate the entire integrated device, even if some of the functions of the integrated devices do not need to be fabricated using that particular technology node. Thus, the integrated device is locked into one technology node. To optimize the cost of a package, some of the functions can be implemented in different integrated devices and/or chiplets, where different integrated devices and/or chiplets may be fabricated using different technology nodes to reduce overall costs. For example, functions that require the use of the most advance technology node may be implemented in an integrated device, and functions that can be implemented using a less advanced technology node can be implemented in another integrated device and/or one or more chiplets. One example, would be an integrated device, fabricated using a first technology node (e.g., most advanced technology node), that is configured to provide compute applications, and at least one chiplet, that is fabricated using a second technology node, that is configured to provide other functionalities, where the second technology node is not as costly as the first technology node, and where the second technology node fabricates components with minimum sizes that are greater than the minimum sizes of components fabricated using the first technology node. Examples of compute applications may include high performance computing and/or high performance processing, which may be achieved by fabricating and packing in as many transistors as possible in an integrated device, which is why an integrated device that is configured for compute applications may be fabricated using the most advanced technology node available, while other chiplets may be fabricated using less advanced technology nodes, since those chiplets may not require as many transistors to be fabricated in the chiplets. Thus, the combination of using different technology nodes (which may have different associated yield loss) for different integrated devices and/or chiplets, can reduce the overall cost of a package, compared to using a single integrated device to perform all the functions of the package.

Another advantage of splitting the functions into several integrated devices and/or chiplets, is that it allows improvements in the performance of the package without having to redesign every single integrated device and/or chiplet. For example, if a configuration of a package uses a first integrated device and a first chiplet, it may be possible to improve the performance of the package by changing the design of the first integrated device, while keeping the design of the first chiplet the same. Thus, the first chiplet could be reused with the improved and/or different configured first integrated device. This saves cost by not having to redesign the first chiplet, when packages with improved integrated devices are fabricated.

Exemplary Sequence for Fabricating and Assembly a Package with a Connector

In some implementations, fabricating a package with a connector includes several processes. FIGS. 9A-9E illustrate an exemplary sequence for providing, fabricating and/or assembling a package with a connector. In some implementations, the sequence of FIGS. 9A-9E may be used to provide, fabricate and/or assemble the package 100 with the connector 101 of FIG. 1. However, the process of FIGS. 9A-9E may be used to fabricate any of the packages (e.g., 200, 300, 400, 500) with a connector described in the disclosure.

It should be noted that the sequence of FIGS. 9A-9E may combine one or more stages in order to simplify and/or clarify the sequence for providing, fabricating and/or assembling a package with a connector. In some implementations, the order of the processes may be changed or modified. In some implementations, one or more of processes may be replaced or substituted without departing from the spirit of the disclosure.

Stage 1, as shown in FIG. 9A, illustrates a carrier 900, an integrated device 109, and a plurality of interconnects 913 (e.g., package interconnects). The back side of the integrated device 109 is coupled to the carrier 900 through an adhesive 919. A plurality of bump interconnects 190 may be coupled to the integrated device 109. The plurality of interconnects 913 is coupled to the carrier 900. The plurality of interconnects 913 may be formed through a deposition process (e.g., plating process). However, different implementations may use different processes for forming the plurality of interconnects 913.

Stage 2 illustrates a state after an encapsulation layer 114 is formed. The encapsulation layer 114 may at least partially encapsulate the integrated device 109, and the plurality of bump interconnects 190. The encapsulation layer 114 may include a mold, a resin and/or an epoxy. A compression molding process, a transfer molding process, or a liquid molding process may be used to form the encapsulation layer 114. A grinding process may be used to flatten out the encapsulation layer 114, which may expose part of the plurality of bump interconnects 190 and/or the plurality of interconnects 913.

Stage 3 illustrates a state after a metallization portion 104 is formed. The metallization portion 104 may include at least one dielectric layer 140 and a plurality of metallization interconnects 142. A deposition process, a masking process, an exposure process, an etching process, a plating process and/or a stripping process may be used to form the metallization portion 104. A deposition, a lamination, an exposure, a development and/or an etching process may be used to form and pattern the at least one dielectric layer. A plating process and/or a patterning process may be used to form the metallization interconnects. The metallization portion 104 is formed such that the metallization portion 104 is coupled to the plurality of interconnects 913 and the plurality of solder interconnects 190.

Figure 9B:
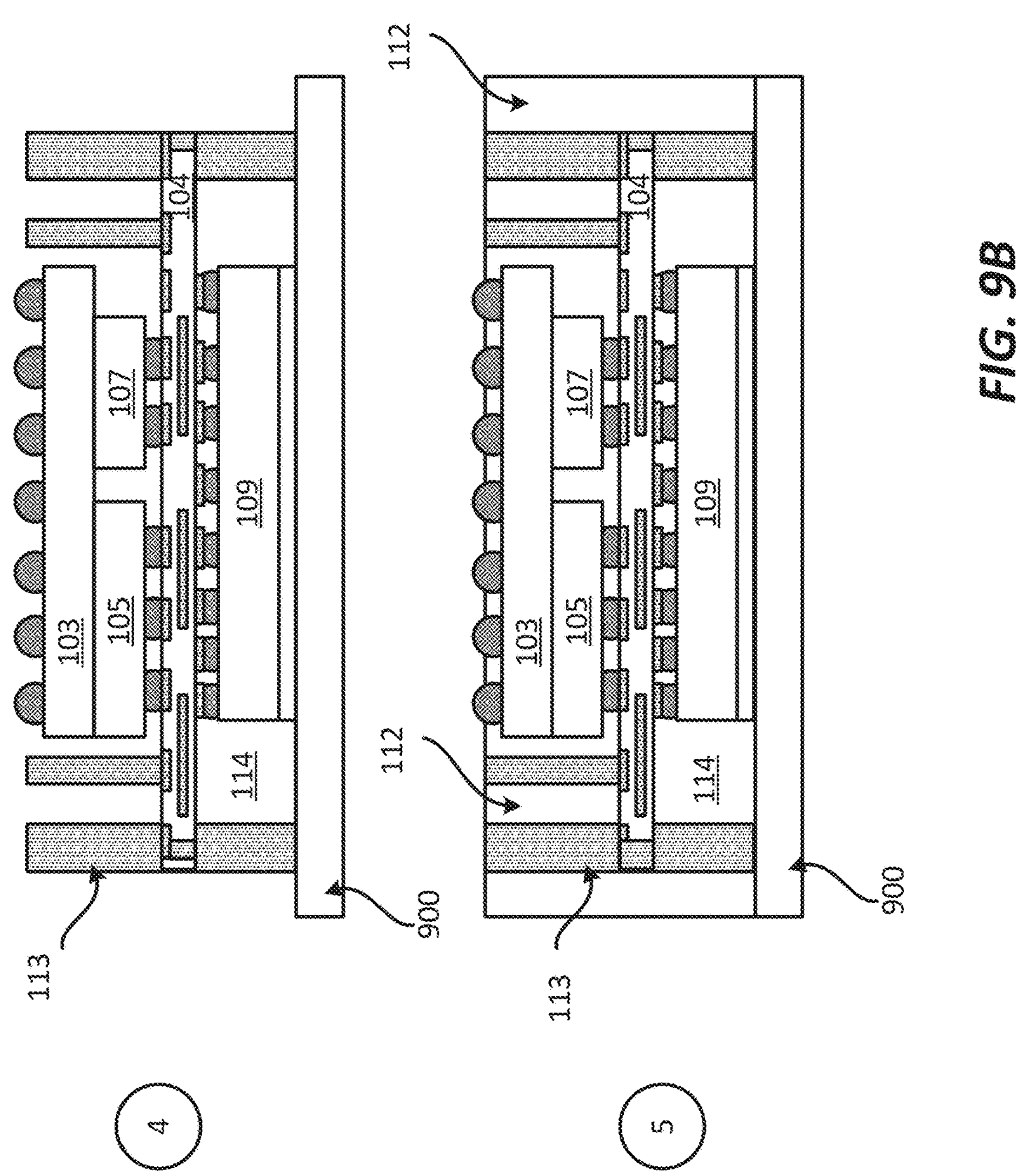

Stage 4, as shown in FIG. 9B, illustrates a state after an integrated device 105, an integrated device 107 and a plurality of post interconnects 113 are provided. The integrated device 105 is coupled to the metallization portion 104 through the plurality of bump interconnects 150. The integrated device 107 is coupled to the metallization portion 104 through the plurality of bump interconnects 170. The plurality of post interconnects 113 may be formed through a deposition process (e.g., plating process). The back side of the integrated device 103 may be coupled to the back side of the integrated device 105 (e.g., through a bump interconnect (e.g., micro bump interconnect) or a hybrid bump interconnect). The back side of the integrated device 103 may be coupled to the back side of the integrated device 107 (e.g., through a bump interconnect (e.g., micro bump interconnect) or a hybrid bump interconnect). A plurality of bump interconnects 130 may be coupled to the integrated device 103. A solder reflow process may be used to couple the integrated device 105 to the metallization portion 104 through the plurality of bump interconnects 150. A solder reflow process may be used to couple the integrated device 107 to the metallization portion 104 through the plurality of bump interconnects 170.

Stage 5 illustrates a state after an encapsulation layer 112 is formed. The encapsulation layer 112 may at least partially encapsulate the integrated device 105, the integrated device 107, the integrated device 103, the plurality of bump interconnects 150, the plurality of bump interconnects 170, the plurality of bump interconnects 130 and the plurality of post interconnects 113. The encapsulation layer 112 may include a mold, a resin and/or an epoxy. A compression molding process, a transfer molding process, or a liquid molding process may be used to form the encapsulation layer 112. A grinding process may be used to flatten out the encapsulation layer 112, which may expose part of the plurality of bump interconnects 130 and/or the plurality of post interconnects 113.

Figure 9C:
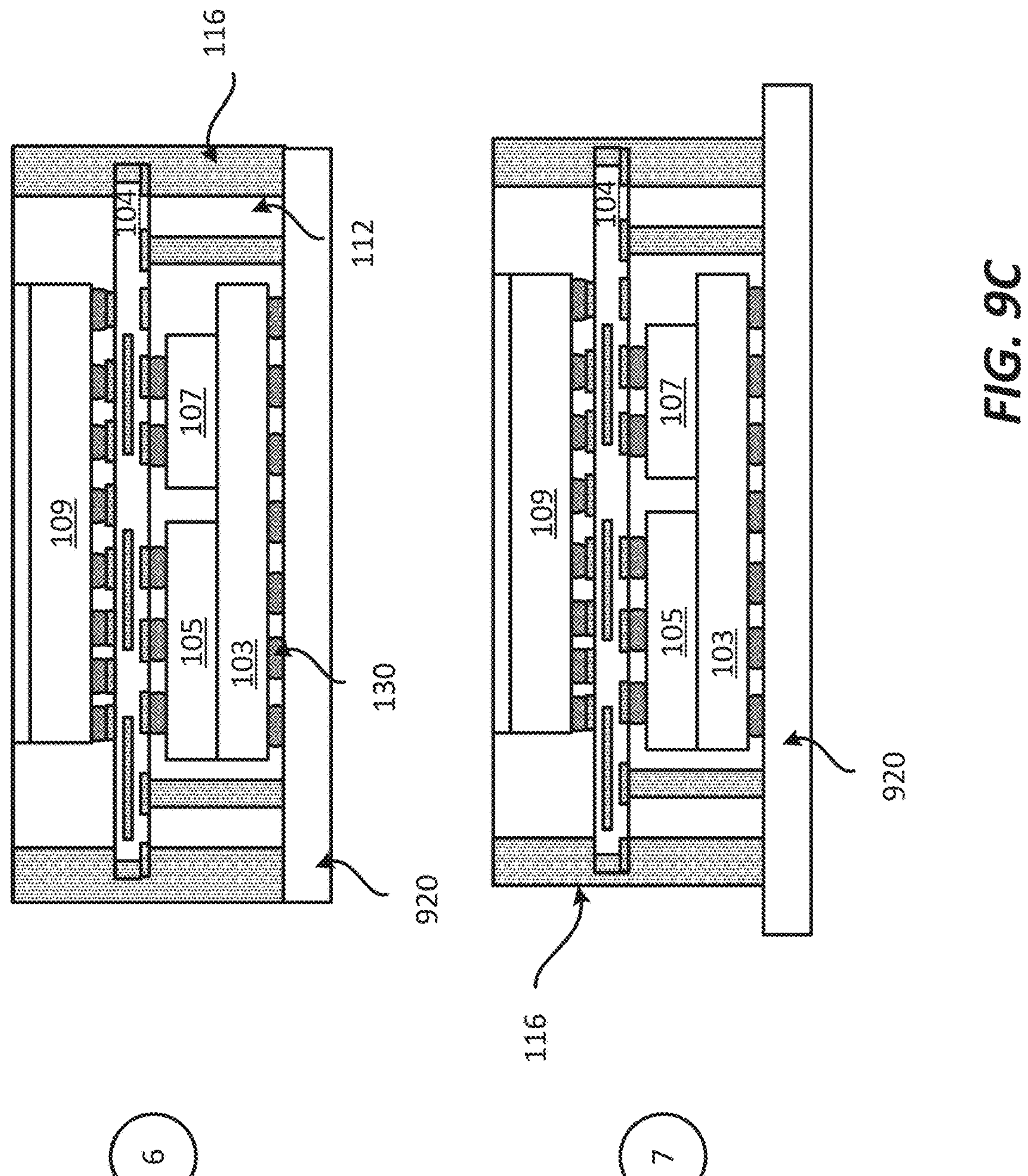

Stage 6, as shown in FIG. 9C, illustrates a state after a plurality of side wall interconnects 116 are formed. In some implementations, the plurality of side wall interconnects 116 are formed after a wafer is cut and/or sliced, exposing part of the plurality of interconnects 913 and part of the plurality of post interconnects 113. The plurality of side wall interconnects 116 may be formed such that the plurality of side wall interconnects 116 are coupled to the plurality of post interconnects 113, the plurality of interconnects 913, and the plurality of metallization interconnects 142. In some implementations, at least some post interconnects from the plurality of post interconnects 113, at least some package interconnects from the plurality of interconnects 913, and/or at least some metallization interconnects from the plurality of metallization interconnects 142 may be considered part of the plurality of side wall interconnects 116. A deposition process (e.g., plating, sputtering) may be used to form the plurality of side wall interconnects 116.

Stage 7 illustrates a state after the carrier 900 is decoupled. A tape 920 is then coupled to the package through the plurality of bump interconnects 130, the encapsulation layer 112 and the plurality of side wall interconnects 116.

Figure 9D:
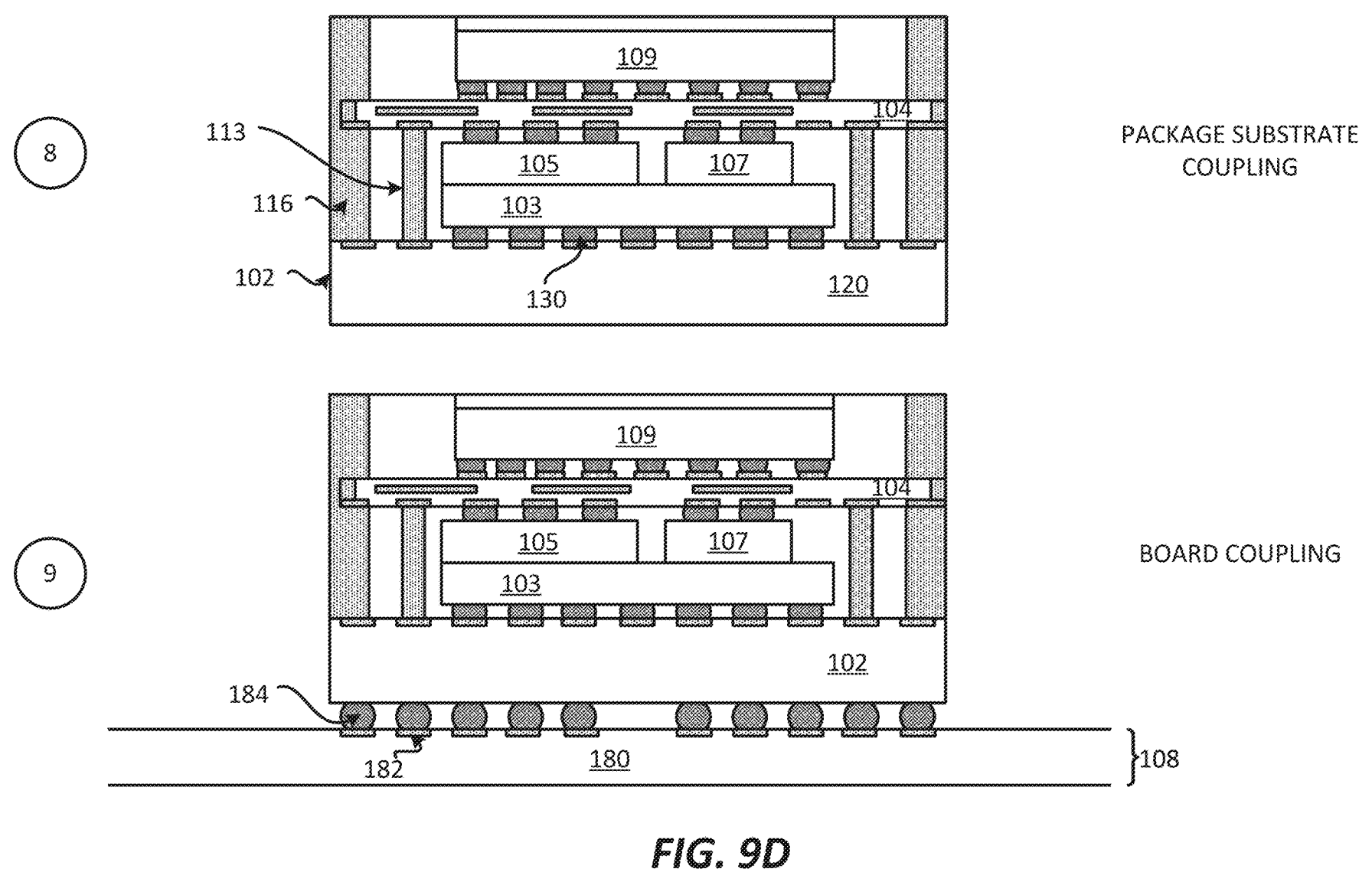

Stage 8, as shown in FIG. 9D, illustrates a state after a substrate 102 is coupled to the plurality of bump interconnects 130. A solder reflow process may be used to couple the substrate 102 to the integrated device 103. Although not shown, additional plurality of bump interconnects similar to the plurality of bump interconnects 130 may be used to couple the plurality of post interconnects 113 and/or the plurality of side wall interconnects 116 to the substrate 102. Thus, in some implementations of the package 100, the package 200, the package 300 and/or the package 400, there may be a plurality of bump interconnects between (i) the plurality of side wall interconnects 116 and interconnects from the plurality of interconnects 122, (ii) the plurality of post interconnects 113 and interconnects from the plurality of interconnects 122, and/or (iii) the plurality of package interconnects 316 and interconnects from the plurality of interconnects 122.

Stage 9 illustrates a state after the substrate 102 is coupled to the board 108 through a plurality of solder interconnects 184. A solder reflow process may be used to couple the substrate 102 to the board 108. The plurality of solder interconnects 184 may be coupled to the plurality of board interconnects 182 of the board 108.

Figure 9E:
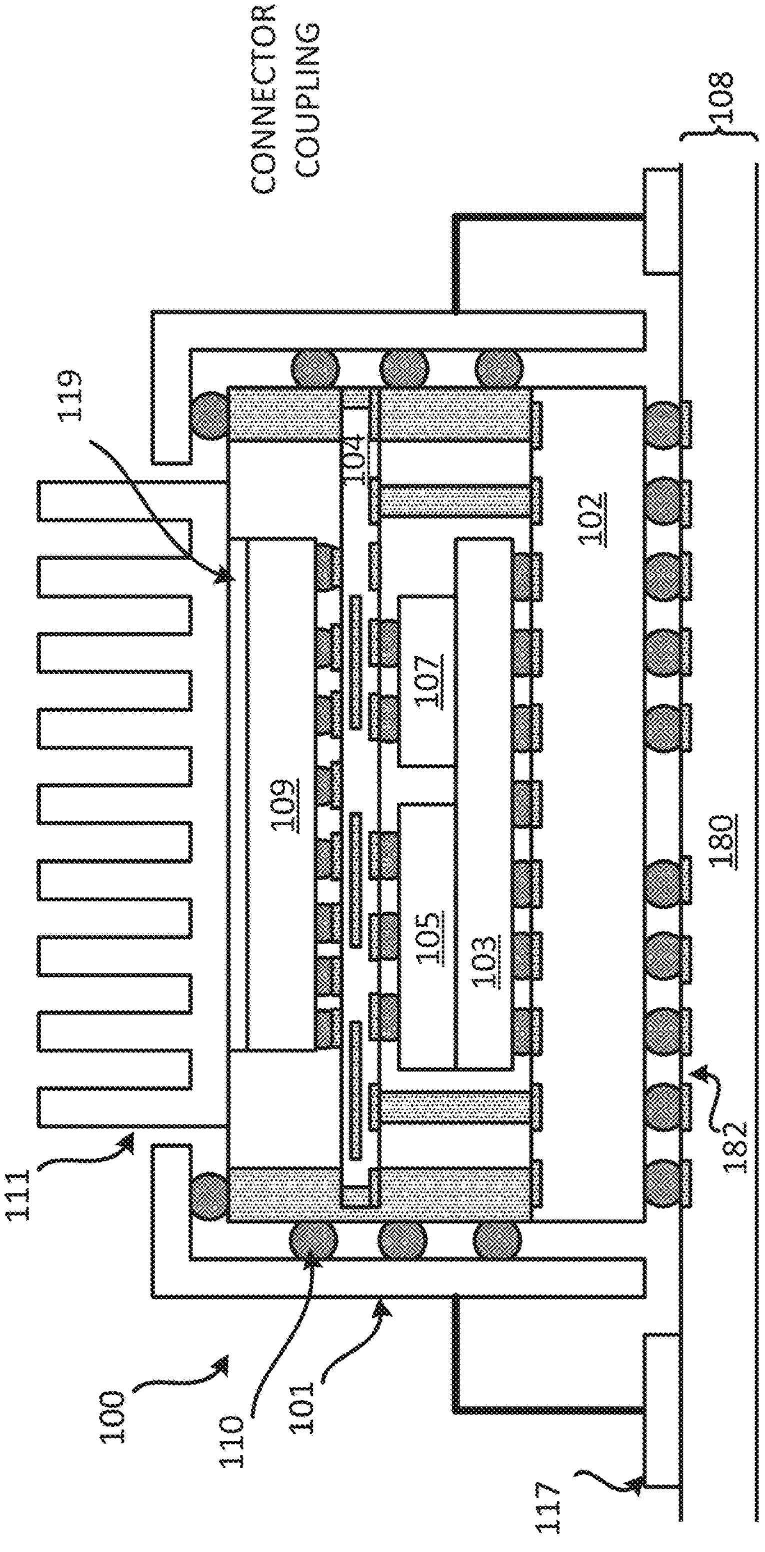

Stage 10, as shown in FIG. 9E, illustrates a state after the heat sink 111 is coupled to the back side of the integrated device 109 through a thermal interface material 119. In some implementations, the adhesive 919 is removed before the thermal interface material 119 is used to couple the integrated device 109 and the heat sink 111. Stage 10 also illustrates a connector 101 coupled to the package 100 through a plurality of solder interconnects 110. The connector 101 may be located at least partially laterally to the package 100. The plurality of board connectors 117 may be coupled to the board 108. Stage 10 illustrates a package 100 and a connector 101 that are coupled to a board 108. The connector 101 is configured to provide one or more power to the package 100 from the board 108.

Exemplary Flow Diagram of a Method for Fabricating and Assembling a Package and a Connector In some implementations, fabricating and assembling a package with a connector includes several processes. FIG. 10 illustrates an exemplary flow diagram of a method 1000 for providing, fabricating and/or assembling a package and a connector. In some implementations, the method 1000 of FIG. 10 may be used to provide, fabricate and/or assemble the packages and connector of at least FIGS. 1-4.

It should be noted that the method 1000 of FIG. 10 may combine one or more processes in order to simplify and/or clarify the method for providing, fabricating and/or assembling a package and a connector. In some implementations, the order of the processes may be changed or modified.

The method provides (at 1005) provides a carrier, an integrated device and a plurality of package interconnects. Stage 1 of FIG. 9A, illustrates an example of a carrier 900, an integrated device 109, and a plurality of interconnects 913 (e.g., package interconnects). The back side of the integrated device 109 is coupled to the carrier 900 through an adhesive 919. A plurality of bump interconnects 190 may be coupled to the integrated device 109. The plurality of interconnects 913 is coupled to the carrier 900. The plurality of interconnects 913 may be formed through a deposition process (e.g., plating process). However, different implementations may use different processes for forming the plurality of interconnects 913.

The method forms (at 1010) an encapsulation layer. Stage 2 of FIG. 9A illustrates an example of a state after an encapsulation layer 114 is formed. The encapsulation layer 114 may at least partially encapsulate the integrated device 109, and the plurality of bump interconnects 190. The encapsulation layer 114 may include a mold, a resin and/or an epoxy. A compression molding process, a transfer molding process, or a liquid molding process may be used to form the encapsulation layer 114. A grinding process may be used to flatten out the encapsulation layer 114, which may expose part of the plurality of bump interconnects 190 and/or the plurality of interconnects 913.

The method forms (at 1015) a metallization portion. Stage 3 of FIG. 9A illustrates an example of a state after a metallization portion 104 is formed. The metallization portion 104 may include at least one dielectric layer 140 and a plurality of metallization interconnects 142. A deposition process, a masking process, an exposure process, an etching process, a plating process and/or a stripping process may be used to form the metallization portion 104. A deposition, a lamination, an exposure, a development and/or an etching process may be used to form and pattern the at least one dielectric layer. A plating process and/or a patterning process may be used to form the metallization interconnects.

The method couples (at 1020) integrated devices and provides (at 1020) post interconnects. Stage 4 of FIG. 9B, illustrates an example of a state after an integrated device 105, an integrated device 107 and a plurality of post interconnects 113 are provided. The integrated device 105 is coupled to the metallization portion 104 through the plurality of bump interconnects 150. The integrated device 107 is coupled to the metallization portion 104 through the plurality of bump interconnects 170. The plurality of post interconnects 113 may be formed through a deposition process (e.g., plating process). The back side of the integrated device 103 may be coupled to the back side of the integrated device 105 (e.g., through a bump interconnect (e.g., micro bump interconnect) or a hybrid bump interconnect). The back side of the integrated device 103 may be coupled to the back side of the integrated device 107 (e.g., through a bump interconnect (e.g., micro bump interconnect) or a hybrid bump interconnect). A plurality of bump interconnects 130 may be coupled to the integrated device 103.

The method forms (at 1025) an encapsulation layer. Stage 5 of FIG. 9B, illustrates a state after an encapsulation layer 112 is formed. The encapsulation layer 112 may at least partially encapsulate the integrated device 105, the integrated device 107, the integrated device 103, the plurality of bump interconnects 150, the plurality of bump interconnects 170, the plurality of bump interconnects 130 and the plurality of post interconnects 113. The encapsulation layer 112 may include a mold, a resin and/or an epoxy. A compression molding process, a transfer molding process, or a liquid molding process may be used to form the encapsulation layer 112. A grinding process may be used to flatten out the encapsulation layer 112, which may expose part of the plurality of bump interconnects 130 and/or the plurality of post interconnects 113.

The method forms (at 1030) side wall interconnects. Stage 6 of FIG. 9C, illustrates a state after a plurality of side wall interconnects 116 are formed. In some implementations, the plurality of side wall interconnects 116 are formed after a wafer is cut and/or sliced exposing part of the plurality of interconnects 913 and part of the plurality of post interconnects 113. The plurality of side wall interconnects 116 may be coupled to the plurality of post interconnects 113, the plurality of interconnects 913, and the plurality of metallization interconnects 142. In some implementations, at least some post interconnects from the plurality of post interconnects 113, at least some package interconnects from the plurality of interconnects 913, and/or at least some metallization interconnects from the plurality of metallization interconnects 142 may be considered part of the plurality of side wall interconnects 116. A deposition process (e.g., plating, sputtering) may be used to form the plurality of side wall interconnects 116. In some implementations, an encapsulation layer (e.g., 312) may be formed that laterally surrounds the plurality of side wall interconnects 116, so that the plurality of side wall interconnects 116 may be considered as a plurality of package interconnects 316.

Once the side wall interconnects or package interconnects are formed, the method may decouple the carrier and a tape may be coupled to the package. Stage 7 of FIG. 9C, illustrates a state after the carrier 900 is decoupled. A tape 920 is then coupled to the package through the plurality of bump interconnects 130, the encapsulation layer 112 and the plurality of side wall interconnects 116.

The method couples (at 1035) a substrate to one or more integrated devices. Stage 8 of FIG. 9D, illustrates an example of a state after a substrate 102 is coupled to the plurality of bump interconnects 130. A solder reflow process may be used to couple the substrate 102 to the integrated device 103.

The method couples (at 1040) the package to a board, and couples (at 1040) the connector to the package. Stage 9 of FIG. 9D, illustrates an example of a state after the substrate 102 is coupled to the board 108 through a plurality of solder interconnects 184. A solder reflow process may be used to couple the substrate 102 to the board 108.

Stage 10 of FIG. 9E, illustrates an example of a state after the heat sink 111 is coupled to the back side of the integrated device 109 through a thermal interface material 119. Stage 10 also illustrates a connector 101 coupled to the package 100 through a plurality of solder interconnects 110. The connector 101 may be located at least partially laterally to the package 100. The plurality of board connectors 117 may be coupled to the board 108. Stage 10 illustrates a package 100 and a connector 101 that are coupled to a board 108. The connector 101 is configured to provide one or more power to the package 100 from the board 108.

Exemplary Electronic Devices

Figure 11:
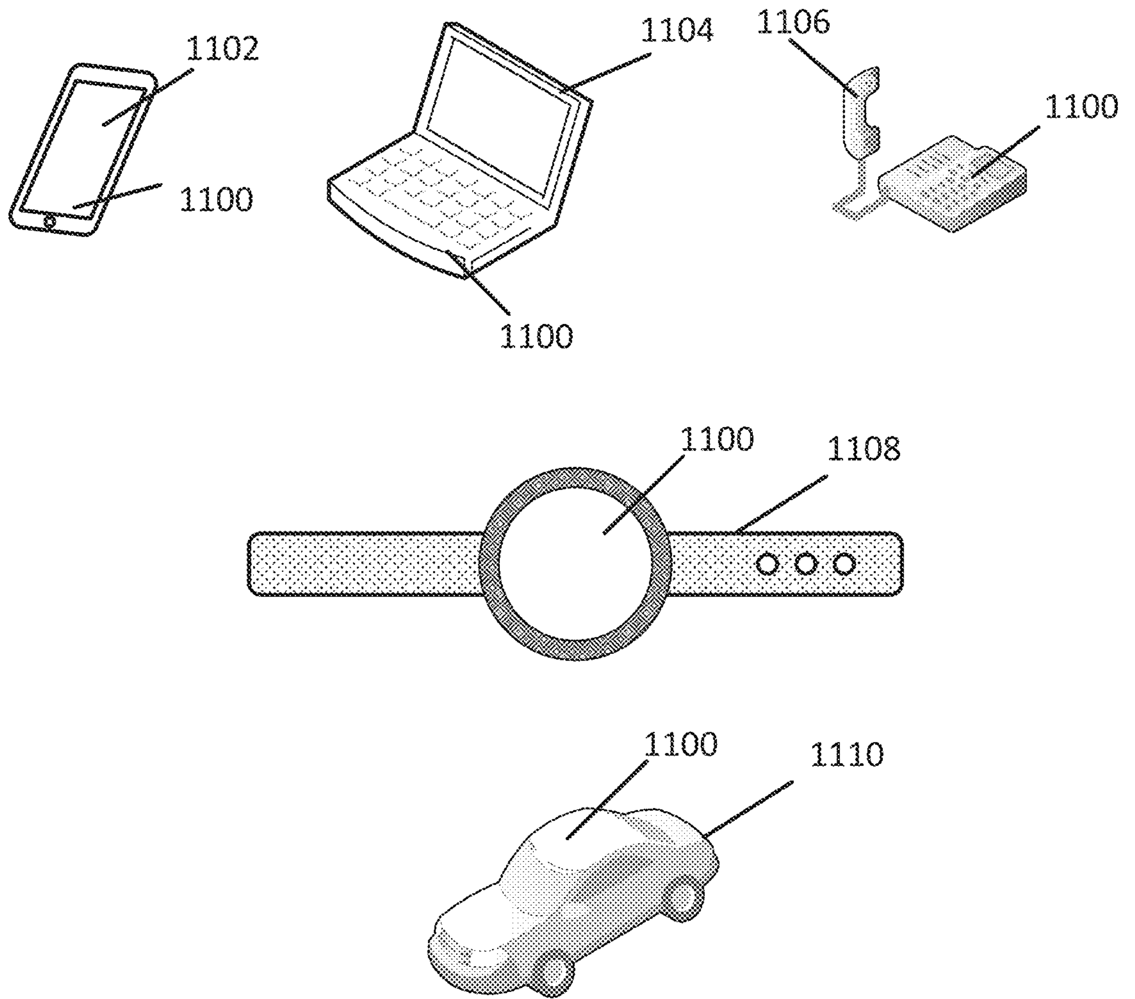
FIG. 11 illustrates various electronic devices that may integrate a die, an integrated device, an integrated passive device (IPD), a passive component, a package, and/or a device package described herein.

FIG. 11 illustrates various electronic devices that may be integrated with any of the aforementioned device, integrated device, integrated circuit (IC) package, integrated circuit (IC) device, semiconductor device, integrated circuit, die, interposer, package, package-on-package (POP), System in Package (SiP), or System on Chip (SoC). For example, a mobile phone device 1102, a laptop computer device 1104, a fixed location terminal device 1106, a wearable device 1108, or automotive vehicle 1110 may include a device 1100 as described herein. The device 1100 may be, for example, any of the devices and/or integrated circuit (IC) packages described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-8, 9A-9E and/or 10-11 may be rearranged and/or combined into a single component, process, feature or function or embodied in several components, processes, or functions. Additional elements, components, processes, and/or functions may also be added without departing from the disclosure. It should also be noted FIGS. 1-8, 9A-9E and/or 10-11 and its corresponding description in the present disclosure is not limited to dies and/or ICs. In some implementations, FIGS. 1-8, 9A-9E and/or 10-11 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. A first component that is "located" in a second component may mean that the first component is "partially located" in the second component or "completely located" in the second component. A first component that is "embedded" in a second component may mean that the first component is "partially embedded" in the second component or "completely embedded" in the second component. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. An interconnect may include one or more metal components (e.g., seed layer+metal layer). In some implementations, an interconnect is an electrically conductive material that may be configured to provide an electrical path for a current (e.g., a data signal, ground or power). An interconnect may be part of a circuit. An interconnect may include more than one element or component. An interconnect may be defined by one or more interconnects. Different implementations may use similar or different processes to form the interconnects. In some implementations, a chemical vapor deposition (CVD) process and/or a physical vapor deposition (PVD) process for forming the interconnects. For example, a sputtering process, a spray coating, and/or an electro plating process or electroless plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A device comprising a package comprising: a package substrate; a first integrated device coupled to the package substrate through a first plurality of bump interconnects; an encapsulation layer at least partially encapsulating the first integrated device; a plurality of post interconnects located in the encapsulation layer; a metallization portion coupled to the plurality of post interconnects; a second integrated device coupled to the metallization portion through a second plurality of bump interconnects; and a plurality of side wall interconnects coupled to the encapsulation layer and the metallization portion.

Aspect 2: The device of aspect 1, further comprising a connector coupled to the package through a third plurality of bump interconnects.

Aspect 3: The device of aspect 2, wherein a bump interconnect from the third plurality of bump interconnects is coupled to a side wall interconnect from the plurality of side wall interconnects.

Aspect 4: The device of aspects 2 through 3, wherein a bump interconnect from the third plurality of bump interconnects is coupled to a top portion of the package.

Aspect 5: The device of aspects 2 through 4, wherein a bump interconnect from the third plurality of bump interconnects is configured to provide an electrical path for ground.

Aspect 6: The device of aspects 2 through 5, wherein a first bump interconnect from the third plurality of bump interconnects is configured to provide a first electrical path for a first power, and wherein a second bump interconnect from the third plurality of bump interconnects is configured to provide a second electrical path for a second power.

Aspect 7: The device of aspect 6, wherein the first bump interconnect is configured to be electrically coupled to the first integrated device, and wherein the second bump interconnect is configured to be electrically coupled to the second integrated device.

Aspect 8: The device of aspects 6 through 7, wherein a third bump interconnect from the third plurality of bump interconnects is configured to provide an electrical path for ground.

Aspect 9: The device of aspects 1 through 8, wherein the plurality of side wall interconnects are coupled to the package substrate.

Aspect 10: The device of aspects 1 through 9, further comprising a second encapsulation layer that is coupled to the plurality of side wall interconnects.

Aspect 11: A device comprising a package comprising: a package substrate; a first integrated device coupled to the package substrate through a first plurality of bump interconnects; an encapsulation layer at least partially encapsulating the first integrated device; a plurality of post interconnects located in the encapsulation layer; a metallization portion coupled to the plurality of post interconnects; a second integrated device coupled to the metallization portion through a second plurality of bump interconnects; and a plurality of package interconnects coupled to the encapsulation layer and the metallization portion, wherein the plurality of package interconnects are embedded in the encapsulation layer.

Aspect 12: The device of aspect 11, further comprising a connector coupled to the package through a third plurality of bump interconnects.

Aspect 13: The device of aspect 12, wherein a bump interconnect from the third plurality of bump interconnects is coupled to a package interconnect from the plurality of package interconnects.

Aspect 14: The device of aspects 12 through 13, wherein a bump interconnect from the third plurality of bump interconnects is coupled to a top portion of the package.

Aspect 15: The device of aspects 12 through 14, wherein a bump interconnect from the third plurality of bump interconnects is configured to provide an electrical path for ground.

Aspect 16: The device of aspects 12 through 15, wherein a first bump interconnect from the third plurality of bump interconnects is configured to provide a first electrical path for a first power, and wherein a second bump interconnect from the third plurality of bump interconnects is configured to provide a second electrical path for a second power.

Aspect 17: The device of aspect 16, wherein the first bump interconnect is configured to be electrically coupled to the first integrated device, and wherein the second bump interconnect is configured to be electrically coupled to the second integrated device.

Aspect 18: The device of aspects 16 through 17, wherein a third bump interconnect from the third plurality of bump interconnects is configured to provide an electrical path for ground.

Aspect 19: The device of aspects 11 through 18, wherein the plurality of package interconnects are coupled to the package substrate.

Aspect 20: The device of aspects 11 through 19, further comprising a second encapsulation layer that is coupled to the plurality of package interconnects.

Aspect 21: The device of aspects 11 through 20, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 22: The device of aspects 1 through 10, wherein the device is selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the aspects. As such, the present teachings can be readily applied to other types of apparatuses and many alternatives, modifications, and variations will be apparent to those skilled in the art.

The invention claimed is:

1. A device comprising:
a package comprising:
a package substrate;
a first integrated device coupled to the package substrate through a first plurality of bump interconnects, wherein the first plurality of bump interconnects are coupled to and touch the first integrated device and the package substrate;
a plurality of post interconnects located at least partially in an encapsulation layer;
a metallization portion coupled to the plurality of post interconnects;
an encapsulation layer at least partially encapsulating the first integrated device, wherein the encapsulation layer is coupled to and touches the package substrate and the metallization portion;
a second integrated device coupled to the metallization portion through a second plurality of bump interconnects, wherein the second plurality of bump interconnects are coupled to and touch the second integrated device and the metallization portion; and
a plurality of side wall interconnects coupled to the encapsulation layer and the metallization portion.

2. The device of claim 1, further comprising:
a connector coupled to the package through a third plurality of bump interconnects, and
one or more wires coupled to the connector.

3. The device of claim 2,
wherein a bump interconnect from the third plurality of bump interconnects is coupled to and touches a side wall interconnect from the plurality of side wall interconnects.

4. The device of claim 2, wherein a bump interconnect from the third plurality of bump interconnects is coupled to and touches a top portion of the package.

5. The device of claim 2, further comprising:
a board coupled to the package through a plurality of solder interconnects; and
a board connector coupled to the board, wherein the board connector is further coupled to the connector through the one or more wires.

6. The device of claim 2,
wherein a first bump interconnect from the third plurality of bump interconnects is configured to provide a first electrical path for a first power,
wherein a second bump interconnect from the third plurality of bump interconnects is configured to provide a second electrical path for a second power, and
wherein a third bump interconnect from the third plurality of bump interconnects is configured to provide an electrical path for ground.

7. The device of claim 6,
wherein the first bump interconnect is configured to be electrically coupled to the first integrated device, and
wherein the second bump interconnect is configured to be electrically coupled to the second integrated device.

8. The device of claim 1
wherein the first integrated device comprises a first front side and a first back side, wherein the first front side of the first integrated device faces in a direction toward the package substrate,
wherein the second integrated device comprises a second front side and a second back side, wherein the second front side of the second integrated device is coupled to a first surface of the metallization portion through the second plurality of bump interconnects,
wherein the package further comprises a third integrated device comprising a third front side and a third back side,
wherein the third front side of the third integrated device is coupled to a second surface of the metallization portion through a third plurality of bump interconnects,
wherein the third back side of the third integrated device faces in a direction toward the first integrated device, and
wherein the third plurality of bump interconnects touch the third integrated device and the metallization portion.

9. The device of claim 1, wherein the plurality of side wall interconnects are coupled to the package substrate.

10. The device of claim 1, further comprising a second encapsulation layer that is coupled to and touches (i) the plurality of side wall interconnects and (ii) the second integrated device, wherein the second encapsulation layer at least partially encapsulates the second integrated device.

11. A device comprising:
a package comprising:
a package substrate;
a first integrated device coupled to the package substrate through a first plurality of bump interconnects, wherein the first plurality of bump interconnects are coupled to and touches the first integrated device and the package substrate;
a plurality of post interconnects located at least partially in an encapsulation layer;
a metallization portion coupled to the plurality of post interconnects;
an encapsulation layer at least partially encapsulating the first integrated device, wherein the encapsulation layer is coupled to and touches the package substrate and the metallization portion,
a second integrated device coupled to the metallization portion through a second plurality of bump interconnects, wherein the second plurality of bump interconnects are coupled to and touches the second integrated device and the metallization portion; and
a plurality of package interconnects coupled to the encapsulation layer and the metallization portion, wherein the plurality of package interconnects are embedded in the encapsulation layer.

12. The device of claim 11, further comprising:
a connector coupled to the package through a third plurality of bump interconnects, and
one or more wires coupled to the connector.

13. The device of claim 12, wherein a bump interconnect from the third plurality of bump interconnects is coupled to and touches a package interconnect from the plurality of package interconnects.

14. The device of claim 12, wherein a bump interconnect from the third plurality of bump interconnects is coupled to and touches a top portion of the package.

15. The device of claim 12, further comprising:
a board coupled to the package through a plurality of solder interconnects; and
a board connector coupled to the board, wherein the board connector is further coupled to the connector through the one or more wires.

16. The device of claim 12,
wherein a first bump interconnect from the third plurality of bump interconnects is configured to provide a first electrical path for a first power,
wherein a second bump interconnect from the third plurality of bump interconnects is configured to provide a second electrical path for a second power, and
wherein a third bump interconnect from the third plurality of bump interconnects is configured to provide an electrical path for ground.

17. The device of claim 16,
wherein the first bump interconnect is configured to be electrically coupled to the first integrated device, and
wherein the second bump interconnect is configured to be electrically coupled to the second integrated device.

18. The device of claim 11
wherein the first integrated device comprises a first front side and a first back side, wherein the first front side of the first integrated device faces in a direction toward the package substrate,
wherein the second integrated device comprises a second front side and a second back side, wherein the second front side of the second integrated device is coupled to a first surface of the metallization portion through the second plurality of bump interconnects,
wherein the package further comprises a third integrated device comprising a third front side and a third back side,
wherein the third front side of the third integrated device is coupled to a second surface of the metallization portion through a third plurality of bump interconnects,
wherein the third back side of the third integrated device faces in a direction toward the first integrated device, and
wherein the third plurality of bump interconnects touch the third integrated device and the metallization portion.

19. The device of claim 11, wherein the plurality of package interconnects are coupled to the package substrate.

20. The device of claim 11, further comprising a second encapsulation layer that is coupled to and touches (i) the plurality of package interconnects and (ii) the second integrated device, wherein the second encapsulation layer at least partially encapsulates the second integrated device.

* * * * *